US007498897B2

(12) United States Patent
Yoshida et al.

(10) Patent No.: US 7,498,897 B2
(45) Date of Patent: Mar. 3, 2009

(54) IMPEDANCE MATCHING CIRCUIT, AND SEMICONDUCTOR ELEMENT AND RADIO COMMUNICATION DEVICE USING THE SAME

(75) Inventors: Keiji Yoshida, Oonojo (JP); Haruichi Kanaya, Kasuga (JP); Tadaaki Tsuchiya, Kurume (JP)

(73) Assignees: Japan Science and Technlogy Agency, Saitama (JP); Logic Research Co., Ltd., Fukuoka (JP)

( * ) Notice: Subject to any disclaimer, the term of this patent is extended or adjusted under 35 U.S.C. 154(b) by 315 days.

(21) Appl. No.: 10/548,758

(22) PCT Filed: Mar. 4, 2004

(86) PCT No.: PCT/JP2004/002751

§ 371 (c)(1), (2), (4) Date: Mar. 10, 2006

(87) PCT Pub. No.: WO2004/082064

PCT Pub. Date: Sep. 23, 2004

(65) Prior Publication Data

US 2006/0170515 A1 Aug. 3, 2006

(30) Foreign Application Priority Data

Mar. 10, 2003 (JP) ............................ 2003-064128

(51) Int. Cl.
*H03H 7/38* (2006.01)
*H01P 5/02* (2006.01)

(52) U.S. Cl. .......................................... 333/33; 333/35

(58) Field of Classification Search .................. 333/33, 333/35, 238, 246
See application file for complete search history.

(56) References Cited

U.S. PATENT DOCUMENTS 4,473,807 A * 9/1984 Weber et al. ................ 333/206

FOREIGN PATENT DOCUMENTS

JP 8-250914 9/1996
JP 9-294001 11/1997
JP 2002-335108 11/2002

OTHER PUBLICATIONS

Haruichi Kanaya et al., "Design and Performance of High $T_c$ Superconducting Coplanar Waveguide Matching Circuit for RF-CMOS LNA", IEICE Transactions on Electronics, vol. E86-C, No. 1, Jan. 2003, pp. 37-42, XP002393686.

(Continued)

*Primary Examiner*—Stephen E Jones
(74) *Attorney, Agent, or Firm*—Wenderoth, Lind & Ponack, L.L.P.

(57) ABSTRACT

An impedance matching circuit, a semiconductor element and a radio communication device using the same, adjusting bandwidth while permitting it to be constructed on the semiconductor element by reducing its occupation area. Since a reactance compensating distributed constant line (31) compensates reactance ($B_L$, $X_S$) of a load (6) and a quarter-wave transmission line (32) and an impedance inverting distributed constant line (33) composing an impedance inverting circuit (K inverter or J inverter) corresponding to the degree of impedance ($Z_L$, $Z_S$) of the load (6) match the impedance ($Z_L$, $Z_S$) of the compensated load (6) and output the input signals (SI1, SI2) at the preset bandwidth, adjustment of bandwidth can be made while miniaturizing the impedance matching circuit (7*a*) by shortening the line length of the reactance compensating distributed constant line (31) and the quarter-wave transmission line (32).

6 Claims, 17 Drawing Sheets

OTHER PUBLICATIONS

Ching-Cheng Tien et al., "Effect of Finite-Width Backside Plane on Overmoded Conductor-Backed Coplanar Waveguide", IEEE Microwave and Guided Wave Letters, IEEE Inc., New York, US, vol. 3, No. 8, Aug. 1, 1993, pp. 259-261, XP000385941, ISSN: 1051-8207.
Belinda Piernas et al., "High-Q Factor Three-Dimensional Inductors", IEEE Transactions on Microwave Theory and Techniques, IEEE Service Center, Piscataway, NJ, US, vol. 50, No. 8, Aug. 2002, pp. 1942-1949, XP011076660, ISSN: 0018-9480.
H. Kanaya et al., "Design of HTS Coplanar Waveguide Matching Circuit for Low Noise CMOS-HTS Receiver", IEEE Transactions on Applied Superconductivity, vol. 13, No. 2, Jun. 2003, pp. 1031-1034, XP002393687.
H. Kanaya et al., "Design of HTS Coplanar Waveguide Matching Circuit for Low-Noise CMOS-HTS Receiver", Applied Superconductivity Conference, Aug. 4-9, 2002.
Yoko Koga et al., "Design and Evaluation of Miniaturized HTS Slot Array Antenna with Bandpass Filter", Technical Report of IEICE, Apr. 10, 2002, pp. 23-28.
T. Takahashi et al., "Proposal and Design of Broadband Miniaturized HTS Antennas", Institute of Electronics, Information and Communication Engineers, Mar. 7, 2000, p. 53.
Takahiro Hamamura et al., "Design of HTS CPW Bandpass Filters Using Meander-Line Parrallel-Circuited Resonators", Technical Report of IEICE, Aug. 22, 2000, pp. 56-65, with English abstract.

* cited by examiner

S=0.5mm²

IMPEDANCE MATCHING CIRCUIT, AND SEMICONDUCTOR ELEMENT AND RADIO COMMUNICATION DEVICE USING THE SAME

TECHNICAL FIELD

The present invention relates to an impedance matching circuit and to a semiconductor element and a radio communication device using the same capable of outputting an input signal within a preset bandwidth and more specifically to an impedance matching circuit and to a semiconductor element and a radio communication device using the same capable of transmitting radio signals such as ultra-high frequency and microwave signals.

BACKGROUND ART

As an impedance matching circuit of this sort, a SAW (surface acoustic wave) filter, for example, is used in a transmitting/receiving circuit of mobile communications such as a portable phone and radio LAN. The SAW filter enables one to set electric power of a signal to be transmitted to the maximum and to set noise of a received signal to the minimum and also enables one to preset a predetermined bandwidth by matching input/output impedance of an amplifier such as a LNA (low noise amplifier) and a PA (power amplifier) with predetermined characteristic impedance, e.g., 50 Ω.

By the way, while an ASIC (application specific integrated circuit) composing a plurality of circuits such as an RF (radio frequency) circuit and a digital signal processing circuit is used lately as the transmitting/receiving circuit described above, it is desired to configure the function of the SAW filter described above on the ASIC to realize SoC (System On a Chip) in which the whole system is configured on one chip in order to downsize and to reduce the cost of the mobile communication terminals.

Then, as shown in FIG. 17, there has been proposed an impedance matching circuit 60 which is composed of a concentrated constant element in which a plurality of spiral inductors 62 are connected and which may be configured on the ASIC as disclosed in, for example, Masayoshi Aikawa, et. al., "Monolithic Microwave Integrated Circuit (MMIC)", Second Edition, The Institute of Electronics, Information and Communication Engineers, May 20, 1998, pp. 83-92).

However, because the impedance matching circuit 60 described above requires a relatively large occupation area as shown in FIG. 17 (for example, the occupation area is about 0.5 $mm^2$ because it is 700 μm square, where L=57.5 nH and 2.4 GHz), there has been a problem that the ASIC is enlarged if the impedance matching circuit 60 is configured on the ASIC as it is. Still more, because the function of the impedance matching circuit 60 is limited to matching of impedance, i.e., it does not function as a filter, there has been a problem that a bandwidth cannot be set.

Accordingly, it is an object of the invention to provide an impedance matching circuit that allows a predetermined bandwidth to be set while allowing to be configured on a semiconductor element by reducing its occupation area and to provide a semiconductor element and a radio communication device using the same.

DISCLOSURE OF INVENTION

According to the invention as set forth in claim 1 (see FIGS. 1 through 16), an impedance matching circuit (7*a*, 7*b*, 7*c*, 7*d*) having a distributed constant line constructed on a dielectric substrate (20) and capable of outputting an input signal (SI1, SI2) with preset bandwidth (W) through the distributed constant line is characterized in that the distributed constant line has a reactance compensating distributed constant line (31, 41) connected to a load (e.g., 5, 6) and having a line length (Δl) of length compensating reactance ($B_L$, $X_S$) of the load, a quarter-wave distributed constant line (32, 42) connected to the reactance compensating distributed constant line (31, 41), having a line length of quarter wavelength (λ/4) of the input signal and having characteristic impedance ($Z_1$, $Y_1$) corresponding to the preset bandwidth (W) and an impedance inverting distributed constant line (33, 43) connected to the quarter-wave distributed constant line (32, 42), composing an impedance inverting circuit (K inverter or J inverter) corresponding to a degree of impedance ($Z_L$, $Z_S$) Of the load and having an inverter ($K_0$,j,$J_{1,2}$) of the impedance inverting circuit corresponding to the preset bandwidth (W).

According to the invention (see FIGS. 1 through 16 for example), the reactance compensating distributed constant line compensates reactance of a load and the quarter-wave transmission line and the impedance inverting distributed constant line composing the impedance inverting circuit corresponding to the degree of impedance of the load match the impedance of the compensated load and output the input signals at the preset bandwidth, so that adjustment of bandwidth can be made. Still more, because the inventive impedance matching circuit is composed of only the reactance compensating distributed constant line, the quarter-wave distributed constant line and the impedance inverting distributed constant line, its occupation area may be reduced.

According to a second aspect of the invention (see FIGS. 1 through 16 for example) the impedance matching circuit (7*a*, 7*b*, 7*c*, 7*d*) as set forth in the first aspect of the invention, the reactance compensating distributed constant line (31, 41), the quarter-wave distributed constant line (32, 42) and the impedance inverting distributed constant line (33, 43) are composed of ground conductors (22) and a signal line (21) formed on one face (20F) of the dielectric substrate (20).

According the second aspect of the invention, the reactance compensating distributed constant line, quarter-wave distributed constant line and impedance inverting distributed constant line are composed of the ground conductors and the signal line formed respectively on one face of the dielectric substrate, i.e., are composed of a coplanar wave-guide. Thereby, differing from a micro-strip line in which thickness of a dielectric substrate must be changed corresponding to characteristic impedance because a signal line and ground conductors are formed respectively on the front and back of the dielectric substrate, the characteristic impedance of the quarter-wave distributed constant line may be easily changed corresponding to a bandwidth and thereby a manufacturing cost of the impedance matching circuit may be reduced.

According to a third aspect of the invention (see FIGS. 9, 10, 14 and 15 for example), which includes the impedance matching circuit (7*a*, 7*b*, 7*c*, 7*d*) as set forth in the second aspect of the invention, the signal line (21) of at least the quarter-wave distributed constant line (32, 42) among the signal lines (21) of the reactance compensating distributed constant line (31, 41) and quarter-wave distributed constant line (32, 42) meanders.

According to the invention as set forth in the third aspect of the invention, the signal line of at least the quarter-wave distributed constant line among the signal lines of the reactance compensating distributed constant line and quarter-wave distributed constant line meanders, so that an area occupied by the ground conductors adjacent to the signal line may be reduced and the impedance matching circuit may be miniaturized further even if the impedance matching circuit is composed of the coplanar wave-guide in which the signal line and the ground conductors are formed on one face of the dielectric substrate.

According to a fourth aspect of the invention (see FIGS. 11 through 15) which includes the impedance matching circuit (*7a*, *7b*, *7c*, *7d*) as set forth in the second aspect of the invention, a ground layer (29) conducting with the ground conductor (22) is formed on the other face (20B) of the dielectric substrate (20).

According to the fourth aspect of the invention, the ground layer communicating with the ground conductor is formed on the other face of the dielectric substrate, so that a loss of input signal may be reduced and efficiency of impedance matching may be improved.

According to a fifth aspect of the invention (see FIGS. 13 through 15 for example), which includes the impedance matching circuit (*7a*, *7b*, *7c*, *7d*) as set forth in the second aspect of the invention, the dielectric substrate (20) is composed of a plurality of laminated dielectric layers (20*a*, 20*b*, 20*c*, 20*d*), at least two dielectric layers (20*c* and 20*d* for example) among the plurality of dielectric layers (20*a*, 20*b*, 20*c*, 20*d*) have ground conductor layers (22D, 22E) and signal layers (21D, 21E) interposed between the ground conductor layers (22D, 22E) via a predetermined gap, inter layer conductive means (51, 52) is provided to conduct between the signal layers (21D, 21E) and between the ground conductors (22D, 22E), the signal line (21) is the signal layer (21D, 21E) conducted by the inter layer conductive means (51) and the ground conductor (22) is the ground conductor layer (22D, 22E) conducted by the inter layer conductive means (52).

According to a sixth aspect of the invention, which includes (see FIGS. 13 through 15 for example) the impedance matching circuit (*7a*, *7b*, *7c*, *7d*) as set forth in the second aspect of the invention, the dielectric substrate (20) is composed of a plurality of laminated dielectric layers (20*a*, 20*b*, 20*c*, 20*d*), at least two dielectric layers (20*c* and 20*d* for example) among the plurality of dielectric layers (20*a*, 20*b*, 20*c*, 20*d*) have ground conductor layers (22D, 22E) and signal layers (21D, 21E) interposed between the ground conductor layers (22D, 22E) via a predetermined gap, an inter layer conductive line (51, 52) is provided to conduct between the signal layers (21D, 21E) and between the ground conductors (22D, 22E), the signal line (21) is the signal layer (21D, 21E) conducted by the inter layer conductive line (51) and the ground conductor (22) is the ground conductor layer (22D, 22E) conducted by the inter layer conductive line (52).

According to the invention as set forth in the fifth or sixth aspects of the invention, the signal line is a plurality of signal layers conducted by the inter layer conductive means or the inter layer conductive lines and the ground conductor is a plurality of ground conductor layers conducted by the inter layer conductive means or the inter layer conductive lines, so that even if the dielectric substrate is constructed by a plurality of laminated dielectric layers, the thickness may be increased by laminating the signal and ground conductor layer of each dielectric layer and thus, a loss of input signal may be reduced. For example, even if the thickness of the signal layer and ground conductor layer is limited due to a design rule in semiconductor manufacturing process, the thickness may be increased and the signal loss may be reduced without problem.

According to seventh aspect of the invention (see FIG. 16 for example), which includes the impedance matching circuit (*7a*, *7b*, *7c*, *7d*) as set forth in the first aspect of the invention, the distributed constant line further includes a narrow band pass distributed constant line (90*a*, 90*b*) having at least one resonance circuit (91*a*, 91*b*, 91*n*-1 or 93*a*, 93*b*, 93*n*-1) having a line length of quarter wavelength (λ/4) of the input signal and an impedance inverting circuit (92*a*, 92*b*, 92*n* or 95*a*, 95*b*, 95*n*) corresponding to a K inverter and a J inverter adjacent to each other via the resonance circuit.

According to the invention as set forth in the seventh aspect of the invention, the impedance matching circuit is provided with the narrow band pass distributed constant line, so that it is capable of functioning as a band pass filter having high cut characteristics. Thereby, it can realize high frequency selectivity even in a narrow bandwidth. Still more, because the line length of the resonance circuit composing the narrow band pass distributed constant line is quarter wavelength and the line length is a half as compared to half wavelength, it prevents the impedance matching circuit from enlarging while composing the band pass filter.

An eight aspect of the invention (see FIGS. 1 through 16 for example) includes a semiconductor element (2) having the impedance matching circuit (*7a*, *7b*, *7c*, *7d*) as set forth in the first aspect of the invention.

According to the eighth aspect of the invention, the semiconductor element has the miniaturized impedance matching circuit, so that the impedance matching circuit may be constructed on the semiconductor element without occupying a large area. It allows SOC (System On a Chip) of constructing the whole system on one chip to be realized.

A ninth aspect of the invention (see FIGS. 1 through 16 for example) includes a radio communication device (1) having the semiconductor element (2) as set forth in the eighth aspect of the invention and an antenna (3) connected to the semiconductor element (2).

According to the invention as set forth in the ninth aspect of the invention, the radio communication device has the semiconductor element having the miniaturized impedance matching circuit, so that parts required in constructing the radio communication device may be constructed on the semiconductor element in advance, thus allowing the miniaturization of the radio communication device and the reduction of the cost thereof.

The invention as set forth in a tenth aspect of the invention (see FIGS. 10D and 10E for example), which includes the impedance matching circuit (*7a*) as set forth in the third aspect of the invention, the signal line (21) meanders so as to adjacent to each other through an intermediary of only a slit (23).

According to the invention as set forth in the tenth aspect of the invention, the impedance matching circuit is formed so that the signal lines are adjacent to each other through an intermediary of only the slit, so that the ground conductor between the meandering signal lines may be eliminated. It allows the area occupied by the ground conductors may be reduced further, allowing the impedance matching circuit to be miniaturized further.

It is noted that the reference numerals within the parentheses are denoted for the purpose of collating with those in the drawings and do not affect by any means the configuration of Claims of the invention.

BRIEF DESCRIPTION OF DRAWINGS

FIGS. 3A, 3B and 3C are explanatory drawings of transmission lines around the impedance matching circuit connected to an input terminal of a low noise amplifier, wherein FIG. 3A is a (partially cut away) top plan view of the transmission line, FIG. 3B is an equivalent circuit of the transmission line and FIG. 3C is an equivalent circuit using a K inverter;

FIGS. 4A, 4B and 4C are explanatory diagrams of a filter composed of the K inverter, wherein FIG. 4A is a circuit diagram of the filter, FIG. 4B shows voltage amplitude of a signal transmitting through the filter and FIG. 4C is an equivalent circuit of the filter;

FIGS. 5A, 5B and 5C are diagrams for explaining characteristic impedance and line length of the impedance matching circuit connected to the input terminal of the low noise amplifier, wherein FIG. 5A is a circuit diagram of the impedance matching circuit, FIG. 5B shows the voltage amplitude of a signal transmitting through the impedance matching circuit and FIG. 5C is an equivalent circuit of the impedance matching circuit;

FIGS. 6A, 6B and 6C are drawings for explaining transmission lines around the impedance matching circuit connected to an output terminal of the low noise amplifier, wherein FIG. 6A is a (partially cut away) top plan view of the transmission line, FIG. 6B is an equivalent circuit of the transmission line and FIG. 6C is an equivalent circuit using a J inverter;

FIGS. 7A, 7B and 7C are diagrams for explaining a filter composed of the J inverters, wherein FIG. 7A is a circuit diagram of the filter, FIG. 7B shows voltage amplitude of a signal transmitting through the filter and FIG. 7C is an equivalent circuit of the filter;

FIGS. 8A, 8B and 8C are diagrams for explaining characteristic impedance and line length of the impedance matching circuit connected to the output terminals of the low noise amplifier, wherein FIG. 8A is a circuit diagram of the impedance matching circuit, FIG. 8B shows voltage amplitude of a signal transmitting through the impedance matching circuit and FIG. 8C is an equivalent circuit of the impedance matching circuit;

FIGS. 10A through 10E are schematic diagrams of the impedance matching circuit represented by equivalent circuits using the K inverter, wherein FIG. 10A shows a case when the transmission line is formed in meander, FIG. 10B shows a case when the transmission line is disposed adjacent to the K inverter, FIG. 10C shows a case when a width of the ground conductor is narrowed, FIG. 10D shows a case when adjacent ground conductors are removed and FIG. 10E shows a case when the transmission line is formed within a ground conductor distance;

FIGS. 11A and 11B are (partially cut away) section views of the impedance matching circuit, wherein FIG. 11A shows a case when a silicon substrate is formed on the back of a dielectric substrate and FIG. 11B shows a case when an earth layer is formed on the back of the dielectric substrate;

FIGS. 14A and 14B are top plan views of the transmission line of the impedance matching circuit having a miniaturized impedance matching transmission line, wherein FIG. 14A shows a case when a fourth metal layer is formed and FIG. 14B shows a case when the fourth metal layer is connected with a fifth metal layer through vias;

FIGS. 16A and 16B are diagrams showing equivalent circuits of the impedance matching circuit multi-staged by alternately connecting inverters and quarter wavelength resonance circuits, wherein FIG. 16A shows the impedance matching circuit connected to the input terminal of the low noise amplifier and FIG. 16B shows the impedance matching circuit connected to the output terminal of the low noise amplifier.

DETAILED DESCRIPTION OF THE INVENTION

Figure 1:
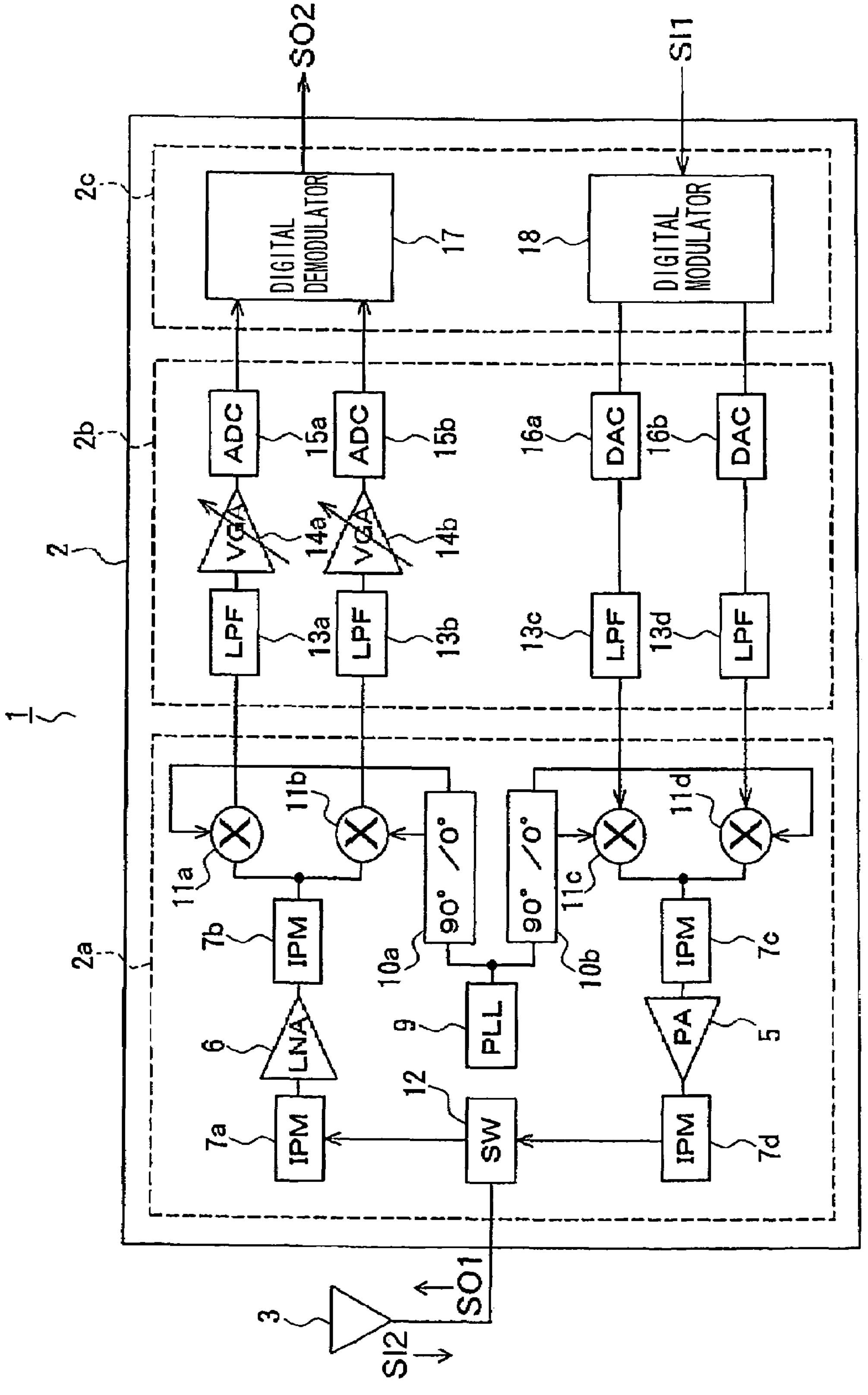
FIG. 1 is a block diagram showing one exemplary radio communication device to which the invention is applied.

Preferred embodiments of the invention will be explained below with reference to the drawings. FIG. 1 is a block diagram showing one example of a radio communication device 1 to which the invention is applied. The radio communication device 1 has a semiconductor element 2 and an antenna 3 such as a whip antenna. The semiconductor element 2 is connected with transmitting means such as a keyboard and a microphone (not shown) and with receiving means such as a display and a speaker (not shown) through an intermediary of a DSP (Digital Signal Processor) also not shown.

The radio communication device 1 of this sort is, for example, mobile communication means such as a portable phone, PHS and PDA (portable information terminal). It may be also communication function adding means for adding the function of mobile communications to a PC (Personal Computer) for example such as a radio LAN card and a radio LAN board. Still more, it may be a fixed telephone as long as it is capable of conducting radio communications and a cordless telephone for example may be included in the radio communication device 1. Still more, the antenna 3 is not specifically limited to be the whip antenna. It may be a plate-like inversed F antenna used as a built-in antenna for receiving only and a slot antenna configured on the semiconductor element 2.

The semiconductor element 2 has an RF (radio frequency) circuit (within a frame of broken line) 2*a*, an A/D converter circuit (within another frame of broken line) 2*b* and a digital signal processing circuit (within a still other frame of broken line) 2*c* and composes an ASIC (application specific integrated circuit). The RF circuit 2*a*, the A/D converter circuit 2*b* and the digital signal processing circuit 2*c* are composed of CMOS (complementary metal oxide semiconductor) and others. It is noted that the circuits composing the semiconductor element 2 are not limited to be the circuits 2*a*, 2*b* and 2*c* described above and are capable of composing various circuits such as a DSP. Still more, they are not limited to be CMOS and may be composed of BiCMOS in which bipolar and CMOS are mixed, bipolar and GaAsFET (gallium arsenide field effect transistor) for example.

The RF circuit 2*a* has a power amplifier (PA) 5, a low noise amplifier (LNA) 6, impedance matching circuits (IMC) 7*a*, 7*b*, 7*c* and 7*d*, a phase lock loop (PLL) 9 composed of a voltage controlled oscillator (not shown) and others, phase shifters 10*a* and 10*b*, mixers 11*a*, 11*b*, 11*c* and 11*d*, a switch (SW) 12 and others. It is noted that the impedance matching circuits 7*a*, 7*b*, 7*c* and 7*d* will be referred to simply as the impedance matching circuit 7 in the following description unless specifically required to discriminate them.

The A/D converter circuit 2*b* has low pass filters (LPF) 13*a*, 13*b*, 13*c* and 13*d*, variable gain amplifiers (VGA) 14*a* and 14*b*, AD converters (ADC) 15*a* and 15*b*, DA converters (DAC) 16*a* and 16*b* and others. The digital signal processing circuit 2*c* has a digital demodulator 17, a digital modulator 18 and others.

The digital signal processing circuit 2*c* is capable of receiving an input signal (signal to be inputted) SI1 described later and the RF circuit 2*a* is capable of outputting an output signal SO1 whose carrier frequency is ultra-high frequency or microwave. The digital signal processing circuit 2*c* is connected with the RF circuit 2*a* via the A/D converter circuit 2*b*, thus forming transmission routes of the input signal SI1 and the output signal SO1.

In concrete, the digital modulator 18 is connected with the mixers 11*c* and 11*d* via the DA converters 16*a* and 16*b* and the low-pass filters 13*c* and 13*d*. The phase lock loop 9 is connected with the mixers 11*c* and 11*d* via the phase shifter 10*b*. Still more, the mixers 11*c* and 11*d* are connected with the antenna 3 via the impedance matching circuit 7*c*, the power amplifier 5, the impedance matching circuit 7*d* and the switch 12.

Meanwhile, the RF circuit 2*a* is capable of inputting an input signal (signal to be inputted) SI2 whose carrier frequency is ultra-high frequency or microwave and the digital signal processing circuit 2*c* is capable of outputting an output signal SO2 described later. The RF circuit 2*a* is connected with the digital signal processing circuit 2*c* via the A/D converter circuit 2*b* as described later to form transmission routes of the input signal SI2 and the output signal SO2.

In concrete, the switch 12 connected with the antenna 3 is connected with the mixers 11*a* and 11*b* via the impedance matching circuit 7*a*, the low noise amplifier 6 and the impedance matching circuit 7*b*. The phase lock loop 9 is connected with the mixers 11*a* and 11*b* via the phase shifter 10*a*. Still more, the mixers 11*a* and 11*b* are connected with the digital demodulator 17 via the low-pass filters 13*a* and 13*b*, the variable gain amplifiers 14*a* and 14*b* and the AD converters 15*a* and 15*b*.

Figure 2:
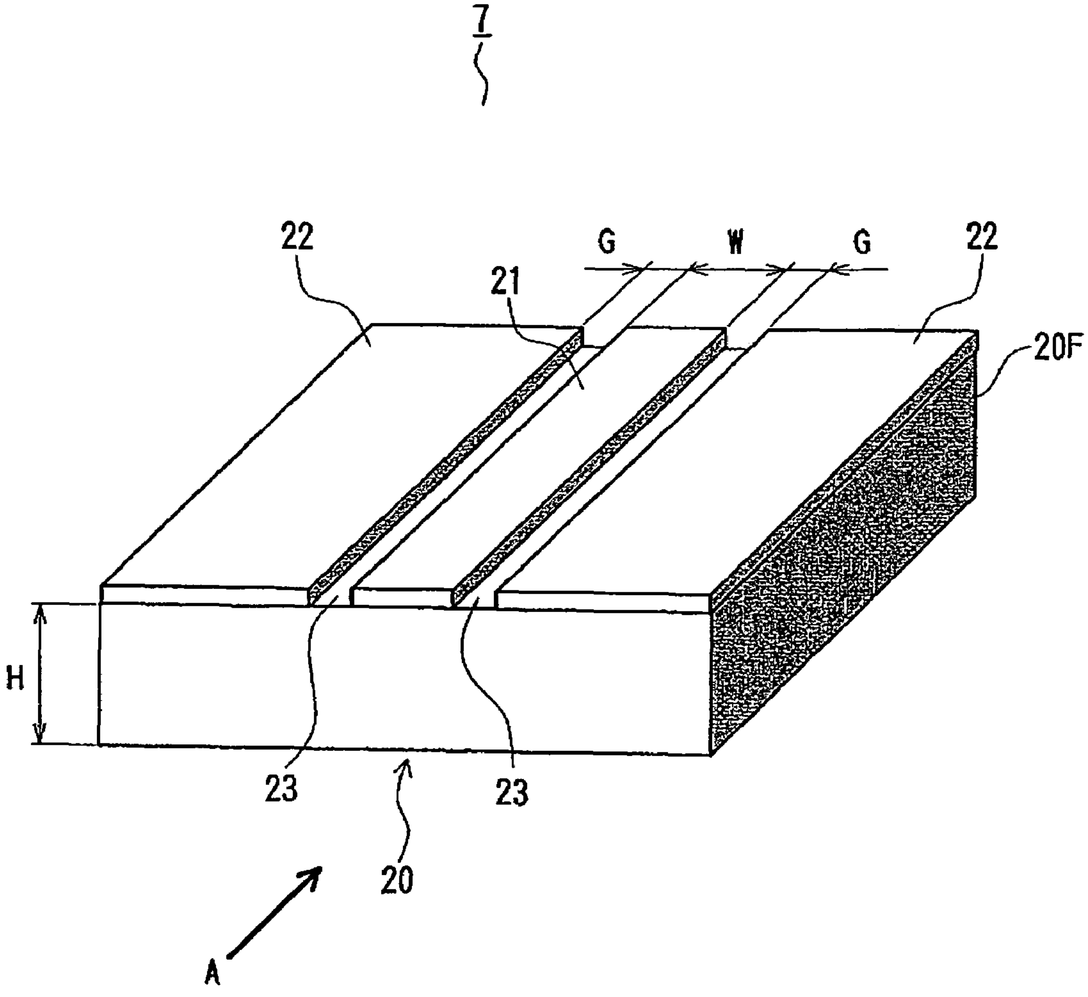
FIG. 2 is a (partially sectional) perspective view showing one exemplary structure of a coplanar wave-guide composing an impedance matching circuit.

Next, a coplanar wave-guide composing the impedance matching circuit 7 in the RF circuit 2*a* will be explained with reference to FIG. 2. FIG. 2 is a (partially sectional) perspective view showing one exemplary structure of the coplanar wave-guide composing the impedance matching circuit 7. As shown in FIG. 2, the impedance matching circuit 7 has a dielectric substrate 20 having a predetermined thickness H and a signal line 21 and ground conductors 22 formed on the surface (one plane of the dielectric substrate) 20F of the dielectric substrate 20. That is, the transmission line of the impedance matching circuit 7 is composed of the coplanar wave-guide (CPW).

The signal line 21 is formed to have a predetermined line width W and the ground conductors 22 are disposed on the both sides of the signal line 21 via slits 23 having a gap (predetermined gap) G. It is noted that characteristic impedance of the impedance matching circuit 7 is determined corresponding to the ratio of the width W and the gap G and the thickness H becomes negligible approximately by constructing the dielectric substrate 20 so that the thickness H is thicker than the width W by five times or more. It is assumed that the dielectric substrate 20 of the present embodiment is also constructed in such a manner.

Figure 3A:
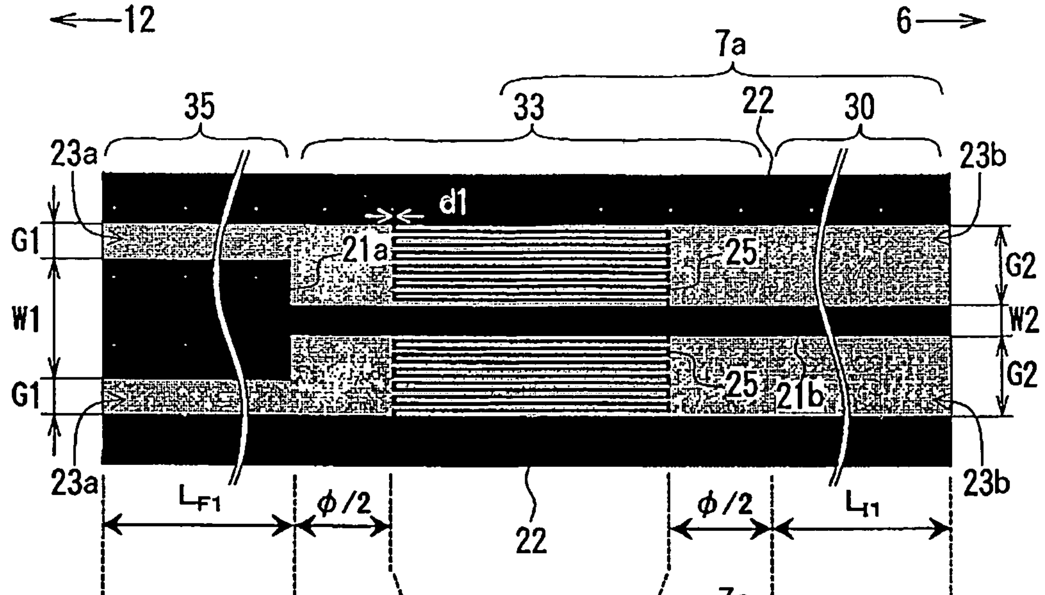
Figure 3B:
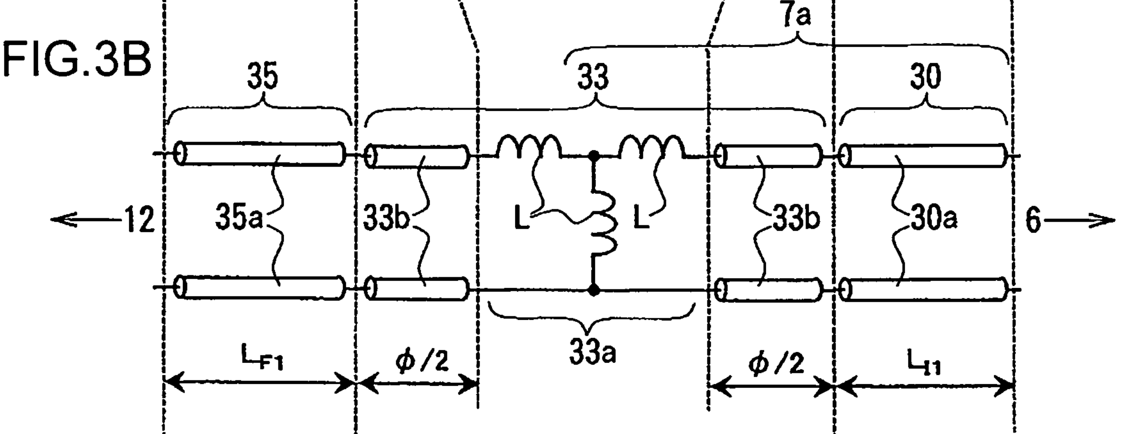
Figure 3C:
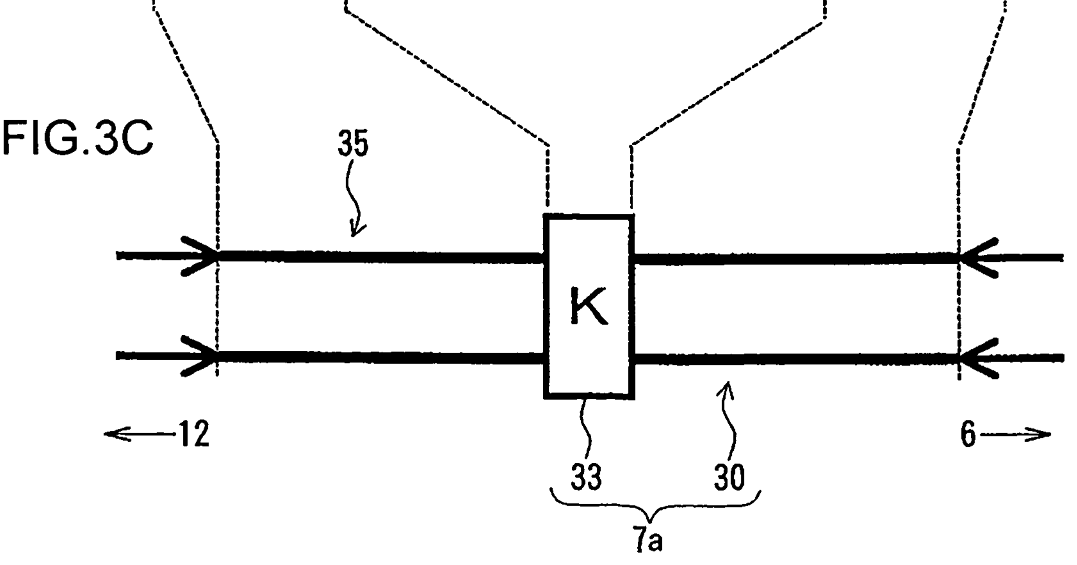

Next, a configuration of the impedance matching circuit 7*a* connected with the low noise amplifier 6 will be explained. FIGS. 3A, 3B and 3C are explanatory drawings of transmission lines around the impedance matching circuit 7*a* connected to an input terminal of the low noise amplifier 6, wherein FIG. 3A is a (partially cut away) top plan view of the transmission lines, FIG. 3B is an equivalent circuit of the transmission lines and FIG. 3C is an equivalent circuit using a K inverter.

As shown in FIG. 3A, the impedance matching circuit 7*a* is composed of the coplanar wave-guide shown in FIG. 2 and has an impedance matching transmission line 30 and a K inverter transmission line (impedance inverting distributed constant line) 33. The left side of the K inverter transmission line 33 in the figure is connected with the switch 12 (see FIG. 1) via a transmission line 35 having characteristic impedance $Z_{35}$ of 50 [Ω] (referred too simply as '$Z_0$' herein after) which is an ordinary value as characteristic impedance. The left side of the impedance matching transmission line 30 in the figure is connected with the low noise amplifier 6 (see FIG. 1).

These impedance matching transmission line 30, K inverter transmission line 33 and transmission line 35 function as a distributed constant line together with the dielectric substrate 20 shown in FIG. 2 when carrier frequency of the signal to be inputted has a predetermined value or more, e.g., when the carrier frequency is high frequency such as ultra-high frequency (300 MHz to 3 GHz), microwave (3 to 30 GHz) and millimetric wave (30 to 300 GHz). In the present embodiment, the carrier frequency is assumed to be ultra-high frequency of 2.45 GHz.

The transmission line 35 is composed of a signal line 21*a* having a line width W1 and the ground conductors 22 via slits 23*a* having a gap G1. Because the characteristic impedance is determined corresponding to the ratio of the width W and the gap G as described above, the characteristic impedance $Z_{35}$ of the transmission line 35 is set so that the ratio of the line width W1 and the gap G1 turns out to be $Z_0$ by setting the width W1 as 17.5 μm and the gap G1 as 5 μm for example. Accordingly, a line length $L_{F1}$ of the transmission line 35 is not specifically limited and may be set to an adequate length.

Meanwhile, the impedance matching transmission line 30 is composed of a signal line 21*b* having a line width W2 (e.g., 4.5 μm) which is narrower than the line width W1 and ground conductors 22 via slits 23*b* having a gap (e.g., 11.5 μm) G2 which is wider than the gap G1 described above and its characteristic impedance $Z_{30}$ is preset to a predetermined value (e.g., 83.4Ω) which is different from that of the transmission line 35 described above (the detail will be described later). A line length $L^{l1}$ of the impedance matching transmission line 30 is preset to a predetermined length which is different from that of the transmission line 35 described above (detail will be described later).

Similarly to the impedance matching transmission line 30, the K inverter transmission line 33 is composed of the signal line 21*b* having the line width W2 and the ground conductors 22 via the slits 23*b* having the gap G2. The signal line 21*b* is connected with the ground conductors 22 through an intermediary of stabs 25 formed in meander and composed of transmission lines having a line width d1.

The K inverter transmission line 33 described above may be represented by an equivalent circuit composed of a T-type circuit 33*a* having inductance L and distributed constant lines 33*b* connected to the both ends of the T-type circuit 33*a* and having a line length of electrical length $\overline{\omega}/2$ as shown in FIG. 3B. The transmission line having the line width d1 and composing the stabs 25 described above is set to have a predetermined line length in configuring the inductance L described above.

Accordingly, the impedance matching circuit 7*a* may be represented by the equivalent circuit composed of the K inverter transmission line 33*a* having the inductance L, the distributed constant lines 33*b* connected to the both sides thereof, the distributed constant lines 30$a$ having the line length $L^{l1}$ and the distributed constant lines 35$a$ having the line length $L_{F1}$ connected to the both sides of the distributed constant lines 33$b$ as shown in FIG. 3B.

Because the K inverter transmission line 33 is composed of the K inverter transmission line 33$a$ having inductance L and the distributed constant lines 33$b$ connected to the both sides thereof as described above, it functions as a K inverter as shown in FIG. 3C.

Here, the inverter is a circuit element through which impedance or admittance of a load seems to be inverted when the load is seen from an input terminal via the inverter. Specifically, a circuit element through which impedance is inverted to see as admittance is called as a K inverter and a circuit element through which admittance is inverted to see as impedance is called as a J inverter. The K inverter is composed of the T-type circuit of inductance L for example as described above and the J inverter is composed of a r-type circuit of capacitor C described later for example.

Figure 4A:
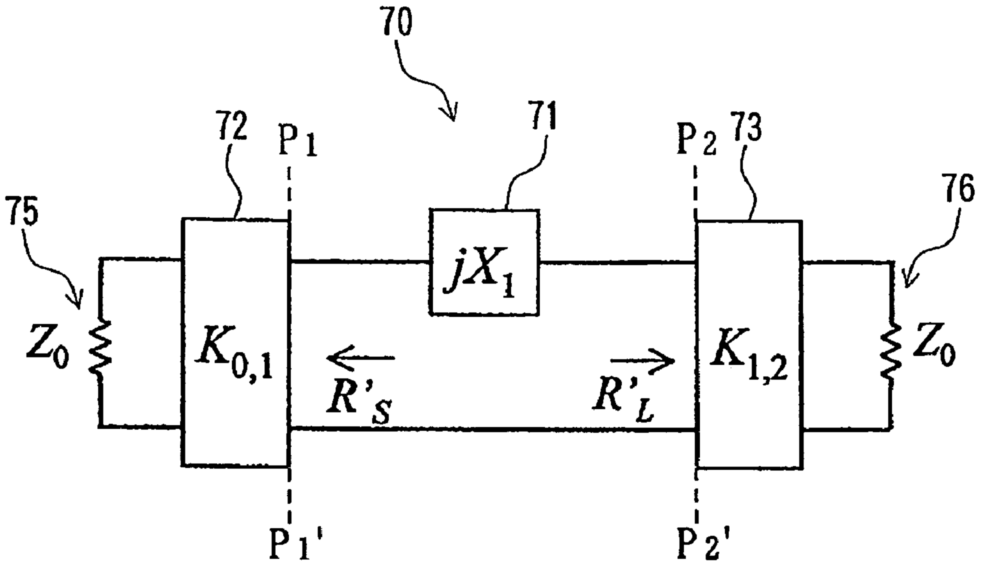
Figure 4B:
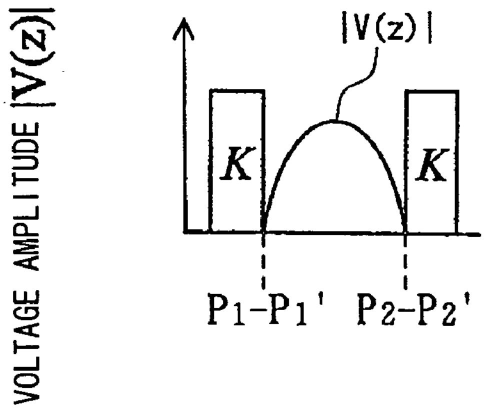
Figure 4C:
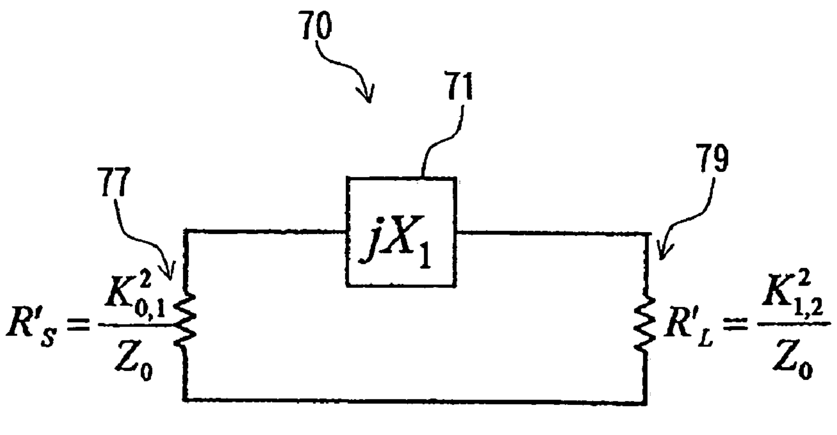

Next, before explaining the characteristic impedance $Z_{30}$ and the line length $L^{l1}$ of the impedance matching transmission line 30, a known filter 70 composed of the K inverter will be explained with reference to FIGS. 4A through 4C. FIGS. 4A, 4B and 4C are explanatory diagrams of the filter 70 composed of the K inverters, wherein FIG. 4A is a circuit diagram of the filter 70, FIG. 4B shows voltage amplitude of a signal transmitting through the filter 70 and FIG. 4C is an equivalent circuit of the filter 70.

The filter 70 is a one-stage filter composed of the K inverters and has a half-wave serial resonator 71 whose reactance is indicated as $jX_1$, a K inverter 72 indicated as $K_{0,1}$ and connected via terminals $P_1$-$P_1'$ and a K inverter 73 indicated as $K_{1,2}$ and connected via terminals $P_2$-$p_2'$. A load 75 indicated as $Z_0$ is connected to the K inverter 72 and a load 76 indicated as $Z_0$ is connected to the K inverter 73. It is noted that resistance seen from the half-wave serial resonator 71 to the K inverter 72 side ($P_1$-$P_1'$ side) is assumed to be $R_s'$ and the resistance seen from the half-wave serial resonator 71 to the K inverter 73 side ($P_2$-$p_2'$ side) is assumed to be $R_L'$.

Here, known design formulas that allow the filter 70 to match impedance and to set a signal to be transmitted in a predetermined bandwidth (band adjustment) may be expressed by the following Equations 1 and 2;

$$K_{0,1} = \sqrt{w}\sqrt{\frac{Z_0 x_1}{g_0 g_1}} \qquad \text{[Equation 1]}$$

$$K_{1,2} = \sqrt{w}\sqrt{\frac{x_1 Z_0}{g_1 g_2}} \qquad \text{[Equation 2]}$$

Where, $x_1$ denotes a slope parameter of reactance $X_1$ and the reactance $X_1$ is expressed by Equation 3. Still more, $\omega$ is frequency, $\omega_0$ is center frequency, w (bandwidth) is specific bandwidth $((\omega_2-\omega_1)/\omega_0)$, $\omega_1$ and $\omega_2$ are cut-off frequencies and $g_0$, $g_1$ and $g_2$ are normalized element values. It is noted that the normalized element values $g_0$, $g_1$ and $g_2$ may be calculated from reflection loss of a pass band (where a ripple is maximized) and a number of stages (of the filter).

$$X_1 = x_1\left(\frac{\omega}{\omega_0} - \frac{\omega_0}{\omega}\right) \qquad \text{[Equation 3]}$$

Because the half-wave serial resonator 71 is constructed between the K inverters 72 and 73, voltage amplitude $|V(z)|$ of a signal transmitting through the half-wave serial resonator 71 becomes short ($|V(z)|=0$) on the terminal sides $P_1$-$P_1'$ and $P_2$-$P_2'$ as shown in FIG. 4B. Still more, the filter 70 is represented by an equivalent circuit in which resistors 77 and 79 indicated as $R_S'$ and $R_L'$ are connected on the both sides of the half-wave serial resonator 71 as shown in FIG. 4C. The resistors 77 and are expressed by the following Equations 4 and 5.

$$R_S' = \frac{K_{0,1}^2}{Z_0} \qquad \text{[Equation 4]}$$

$$R_L' = \frac{K_{1,2}^2}{Z_0} \qquad \text{[Equation 5]}$$

Still more, Equations 6 and 7 hold in the half-wave serial resonator 71 described above. It is noted that Q (value Q) means quality factor.

$$\frac{R_L'}{R_S'} = \frac{g_0}{g_2} \qquad \text{[Equation 6]}$$

$$Q = \frac{x_1}{R_S' + R_L'} = \frac{g_0 g_1 g_2}{w(g_0 + g_2)} \qquad \text{[Equation 7]}$$

Because the K inverters 72 and 73 thus invert impedance, i.e., the half-wave serial resonator 71, to admittance (half-wave parallel resonator) as described above, the filter 70 is equivalent with the half-wave parallel resonator not shown. Accordingly, the filter 70 functions as one stage filter by the half-wave parallel resonator and based on Equations 1 and 2 described above, enables the impedance matching and band adjustment by setting the specific bandwidth w.

Such half-wave serial resonator 71 is composed of a transmission line not shown having a line length of a half-wave of the signal to be transmitted. The K inverters 72 and 73 are composed, respectively, of the T-type circuit of inductance L and transmission lines not shown connected on the both sides thereof and having a line length of electrical length $\overline{\omega}/2$ similarly to the K inverter transmission line 33 shown in FIG. 3B.

Because a plurality of circuits are constructed on the semiconductor element 2 to construct the ASIC as described above, the space on the semiconductor element 2 is limited and an occupation area of the filter 70 must be reduced further in order to construct it on the semiconductor element 2. Then, in the impedance matching circuit 7 of the invention, the characteristic impedance $Z_{30}$ and the line length $L^{l1}$ of the impedance matching transmission line 30 are set at predetermined values so that the occupation area may be reduced as compared to the filter 70 while meeting Equations 1 and 2 similarly to the filter 70 described above.

Figure 5A:
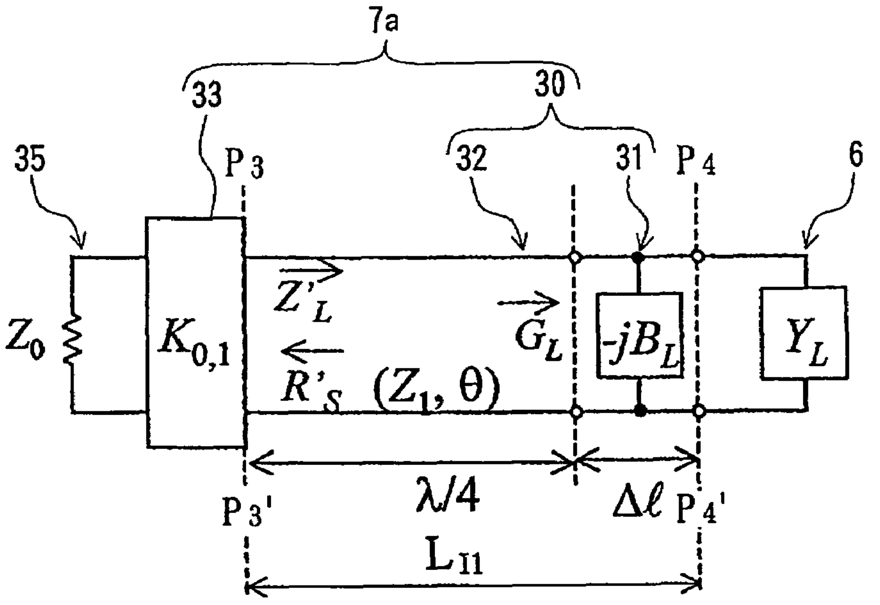
Figure 5B:
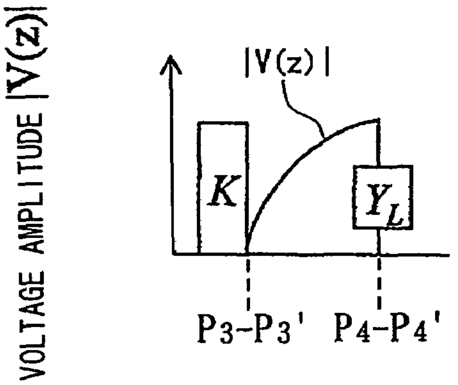
Figure 5C:
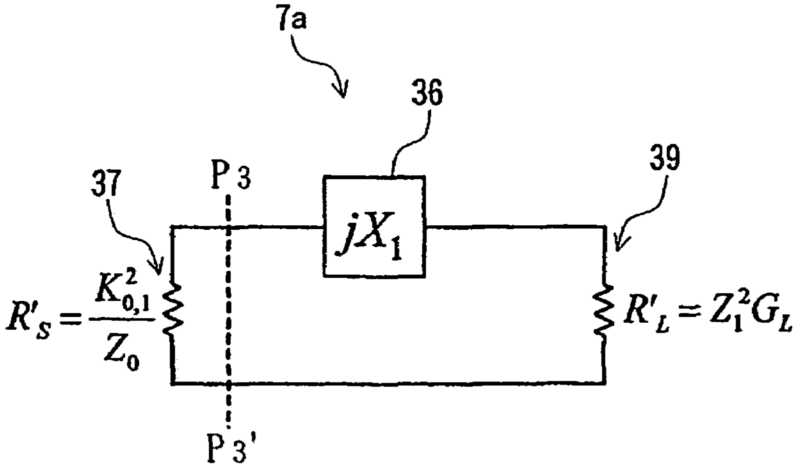

Next, the characteristic impedance $Z_{30}$ and the line length $L^{l1}$ of the impedance matching transmission line 30 will be explained with reference to FIGS. 5A through 5C. FIGS. 5A, 5B and 5C are diagrams for explaining the characteristic impedance and line length of the impedance matching circuit 7$a$ connected to the input terminal of the low noise amplifier 6, wherein FIG. 5A is a circuit diagram of the impedance matching circuit 7$a$, FIG. 5B shows the voltage amplitude of a signal transmitting through the impedance matching circuit 7$a$ and FIG. 5C is an equivalent circuit of the impedance matching circuit 7$a$.

The impedance matching circuit 7*a* shown in FIG. 5A is composed of the impedance matching transmission line 30 and the K inverter transmission line 33 as explained with reference to FIG. 3. The impedance matching transmission line 30 is composed of a quarter-wave transmission line (quarter-wave distributed constant line) 32 having characteristic impedance $Z_1$ (described later) and a reactance compensating transmission line (reactance compensating distributed constant line) 31 connected with the quarter-wave transmission line 32. Line length of the quarter-wave transmission line 32 is a quarter of wavelength λ of the signal to be transmitted, i.e., quarter wavelength λ/4 (quarter-wavelength of the signal to be inputted). The quarter-wave transmission line 32 is connected with the K inverter transmission line 33 via input terminals $P_3$-$P_3'$ and the K inverter transmission line 33 is connected with the transmission line 35. Still more, the reactance compensating distributed constant line 31 is connected with the low noise amplifier 6 (see FIG. 1) via output terminals $P_4$-$P_4'$.

It is noted that the wavelength λ described above means guide wavelength and when a signal transmits through the impedance matching circuit 7, the carrier frequency described above increases corresponding to dielectric constant of the dielectric substrate 20 shown in FIG. 2 and the wavelength λ becomes smaller than one wavelength of the carrier frequency of 2.45 GHz.

The line length of the quarter-wave transmission line 32 is thus set to be a half of the half-wave transmission line not shown composing the half-wave serial resonator 71 of the filter 70 explained in connection with FIG. 4A. Still more, because input impedance of the low noise amplifier 6 is relatively large, e.g., 330-j890Ω, the low noise amplifier 6 may be handled open and two K inverters are not necessary. Then, the K inverter transmission line 33 composes the K inverter (inverter of impedance invert circuit) $K_{0,1}$ only on the input terminal side $P_3$-$P_3'$. That is, voltage amplitude |V(z)| of the signal transmitting through the quarter-wave transmission line 32 is quarter-wave as shown in FIG. 5B and is short (|V(z)|=0) on the input terminal side $P_3$-$P_3'$. It is opened (amplitude is maximized) on the output terminal side $P_4$-$P_4'$.

In order to apply Equations 1 and 2 described above while thus setting the line length of the quarter-wave transmission line 32 to quarter-wavelength λ/4, the line length of the reactance compensating distributed constant line 31 is set at adjusted length (length compensating reactance of load) Δl so as to compensate (cancel) susceptansce $B_L$ of the low noise amplifier 6.

Here, input admittance $Y_L$ of the low noise amplifier 6 is defined as shown in Equation 8. Where, $G_L$ denotes the conductance of the low noise amplifier 6 and $B_L$ denotes the susceptance (reactance of load) of the low noise amplifier 6.

$$Y_L = \frac{1}{Z_L} \equiv G_L + jB_L \quad \text{[Equation 8]}$$

The input impedance (impedance of load) $Z_L$ of the low noise amplifier 6 is expressed by Equation 9. Where, $R_L$ denotes resistance of the input impedance $Z_L$ and $X_L$ denotes reactance of the input impedance $Z_L$.

$$Z_L = R_L + jX_L \quad \text{[Equation 9]}$$

Then, the conductance $G_L$ and susceptance $B_L$ of the low noise amplifier 6 may be expressed by Equation 10.

$$G_L = \frac{R_L}{R_L^2 + X_L^2},\ B_L = \frac{-X_L}{R_L^2 + X_L^2} \quad \text{[Equation 10]}$$

By the way, because the reactance may be increased/decreased similarly with loading of inductance by increasing/decreasing the line length (quarter wavelength λ/4) of the quarter-wave transmission line 32, the adjusted length Δl of the reactance compensating distributed constant line 31 is preset so as to meet with Equation 1. It is noted that C denotes capacity (C/m) per unit length.

$$\omega_0 C\Delta l = -B_L \quad \text{[Equation 11]}$$

Accordingly, the adjusted length Δl of the reactance compensating distributed constant line 31 may be expressed by the length shown by Equation 12.

$$\Delta l = -\frac{B_L}{\omega_0 C} \quad \text{[Equation 12]}$$

It is noted that because the low noise amplifier 6 is composed of FET (field effect transistor) and capacity between a gate and source not shown is positive, $X_L<0$, $B_L>0$ from Equation 10 and $\Delta l<0$ from Equation 12.

Because the line length of the quarter-wave transmission line 32 is quarter wavelength λ/4 and the line length of the reactance compensating distributed constant line 31 is the adjusted length Δl as described above, the line length $L_{l1}$ of the impedance matching transmission line 30 is λ/4+Δl as shown in FIG. 5A. Still more, because Δl<0, the line length $L_{l1}$ of the impedance matching transmission line 30 becomes a length obtained by subtracting an absolute value of the adjusted length Δl of the reactance compensating distributed constant line 31 from the line length (quarter wavelength λ/4) of the quarter-wave transmission line 32.

When the carrier frequency is 2.45 GHz, while quarter wavelength λ/4 is about 18 mm, the line length $L_{l1}$ of the impedance matching transmission line 30 becomes about 17 mm because the adjusted length Δl is −0.9 mm when the input impedance $z_L$ of the low noise amplifier 6 is 330-j890Ω for example.

When the susceptance $B_L$ is compensated as described above, impedance matching and band adjustment of the low noise amplifier 6 may be made possible similarly to the filter 70 by applying Equations 1 and 2 described above to the impedance matching circuit 7.

Here, because the low noise amplifier 6 has relatively large impedance ($Z_L$) as described above, $G_L \ll Y_0$, where $Y_0$ is an inverse number of $Z_0$ and Equations 13 through 17 hold.

$$Z_L' = Z_1^2 G_L + jX_1 \equiv R_L' + jX_L' \quad \text{[Equation 13]}$$

$$X_1 = -Z_1 \cot\theta \equiv -x_1\left(\frac{\omega}{\omega_0} - \frac{\omega_0}{\omega}\right) \quad \text{[Equation 14]}$$

$$x_1 = \frac{\pi}{4} Z_1 \quad \text{[Equation 15]}$$

$$R_L' = Z_1^2 G_L \quad \text{[Equation 16]}$$

$$R_S' = \frac{K_{0,1}^2}{Z_0} \quad \text{[Equation 17]}$$

Accordingly, the design formula shown in Equation 2 may be expressed by Equation 18 from Equations 2, 5, 15 and 16 as the characteristic impedance (characteristic impedance corresponding to the preset bandwidth) $Z_1$ of the quarter-wave transmission line 32. Still more, the design formula shown in Equation 1 may be expressed by Equation 19 as the K inverter $K_{0,1}$ composed of the K inverter transmission line 33.

$$Z_1 = \frac{\pi}{4}\frac{w}{g_1 g_2 G_L} \quad \text{[Equation 18]}$$

$$K_{0,1} = \sqrt{w}\sqrt{\frac{Z_0 x_1}{g_0 g_1}} \quad \text{[Equation 19]}$$

Because the impedance matching transmission line 30 is composed of the line width W2 and the gap G2 as shown in FIG. 3A (i.e., the characteristic impedance is maintained constant) and the impedance matching transmission line 30 is composed of the reactance compensating distributed constant line 31 and the quarter-wave transmission line 32 as explained in FIG. 5A, the characteristic impedance $Z_{30}$ (83.4Ω) of the impedance matching transmission line 30 is expressed by the characteristic impedance $Z_1$ described above.

Because Equations 18 and 19 are met, the circuit diagram of the impedance matching circuit 7*a* shown in FIG. 5A may be expressed by an equivalent circuit seen from the half-wave serial resonator as shown in FIG. 5C similarly to the equivalent circuit shown in FIG. 4C. That is, the impedance matching circuit 7*a* is represented by the equivalent circuit in which resistors 37 and denoted by $R_S'$ and $R_L'$ are connected to the both sides of the half-wave serial resonator 36. The resistors 37 and 39 may be expressed by Equation 20 from Equations 6, 16 and 17. The quality factor Q may be expressed by Equation 21 from Equations 7, 16 and 17.

$$\frac{R_L'}{R_S'} = \frac{Z_0}{K_{0,1}^2} Z_1^2 G_L = \frac{g_0}{g_2} \quad \text{[Equation 20]}$$

$$Q = \frac{x_1}{R_S' + R_L'} = \frac{Z_0}{K_{0,1}^2} \frac{x_1}{\left(1 + \frac{g_0}{g_2}\right)} = \frac{g_0 g_1 g_2}{w(g_0 + g_2)} \quad \text{[Equation 21]}$$

Thus, differing from the filter 70 shown in FIG. 4, the inventive impedance matching circuit 7*a* does not require two K inverters and allows the line length $L_{I1}$ of the impedance matching transmission line 30 to be set as λ/4+Δl. Still more, because the characteristic impedance $Z_1$ of the quarter-wave transmission line 32, i.e., the characteristic impedance $Z_{30}$ of the impedance matching transmission line 30, and the $K_{0,1}$ of the K inverter 33 composed of the K inverter transmission line 33 are set so as to meet with Equations 18 and 19, it allows the impedance matching and band adjustment to be carried out corresponding to the specific bandwidth w while reducing the occupation area of the impedance matching circuit 7*a*.

Still more, the inventive impedance matching circuit 7 also allows the impedance matching and bandwidth adjustment in the same manner as described above not only for relatively large impedance such as the input impedance $Z_L$ of the low noise amplifier 6, but also for relatively small impedance such as the output impedance $Z_S$ (described later) of the low noise amplifier 6.

Figure 6A:
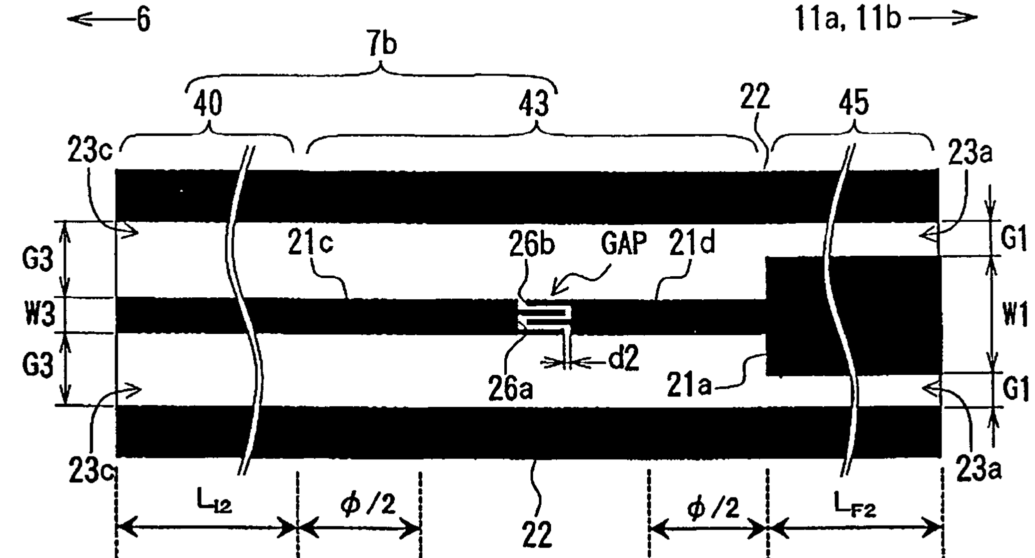
Figure 6B:
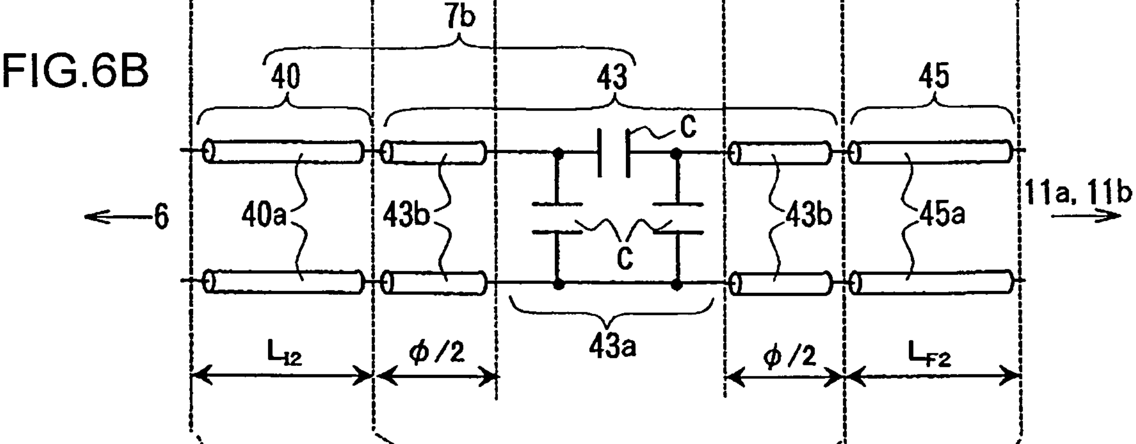
Figure 6C:
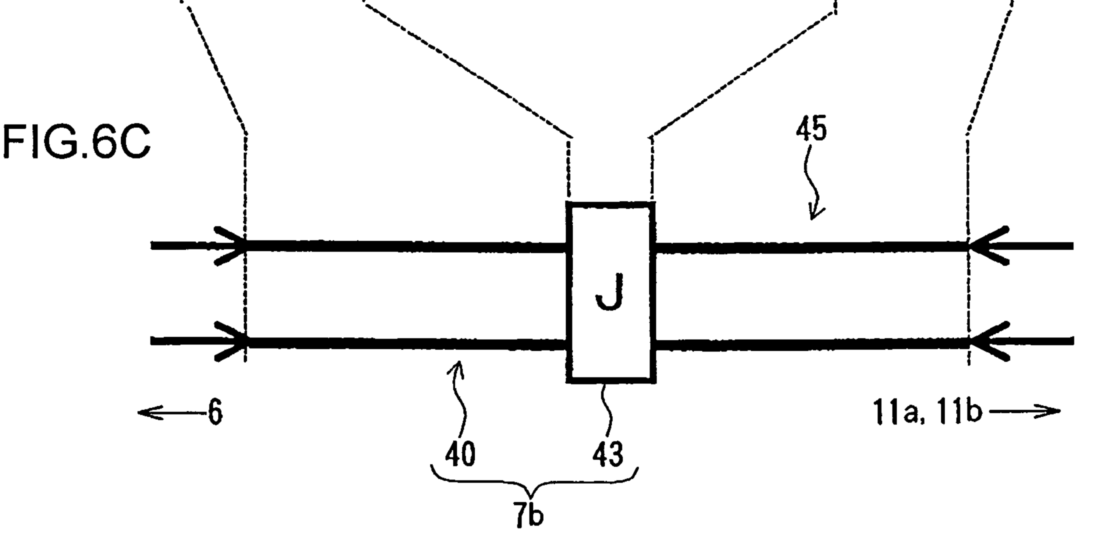

Next, the configuration of the impedance matching circuit 7*b* connected with the output terminal of the low noise amplifier 6 will be explained. FIGS. 6A, 6B and 6C are drawings for explaining transmission lines around the impedance matching circuit 7*b* connected to the output terminal of the low noise amplifier 6, wherein FIG. 6A is a (partially cut away) top plan view of the transmission line, FIG. 6B is an equivalent circuit of the transmission line and FIG. 6C is an equivalent circuit using the J inverter.

As shown in FIG. 6A, the impedance matching circuit 7*b* is composed of the coplanar wave-guide shown in FIG. 2 similarly to the impedance matching circuit 7*a* and has an impedance matching transmission line 40 and a J inverter transmission line (impedance inverting distributed constant line) 43. The right side of the J inverter transmission line 43 in the figure is connected with the mixers 11*a* and 11*b* (see FIG. 1) via a transmission line 45 having characteristic impedance $Z_{45}$ of $Z_0$. Still more, the left side of the impedance matching transmission line 40 in the figure is connected with the low noise amplifier 6 (see FIG. 1). The impedance matching transmission line 40, the J inverter transmission line 43 and the transmission line 45 function as a distributed constant circuit together with the dielectric substrate 20 shown in FIG. 2 similarly to the distributed constant circuit explained in conjunction with FIG. 3.

Similarly to the transmission line 35 of the impedance matching circuit 7*a* (see FIG. 3), the transmission line 45 is composed of the signal line 21*a* having a line width W1 and the ground conductors 22 formed via the slits 23*a* having a gap G1. The line length $L_F$ of the transmission line 45 is not specifically limited and may be set at adequate length.

Meanwhile, the impedance matching transmission line 40 is composed of the signal line 21*c* having a line width W3 which is narrower than the line width W1 described above and the ground conductors 22 formed via slits 23*c* having a gap G3 which is wider than the gap G1 described above. Accordingly, characteristic impedance $Z_{40}$ of the impedance matching transmission line 40 is preset at a predetermined value (detail will be described later), which is different from that of the transmission line 45 described above. Still more, the line length $L_{12}$ of the impedance matching transmission line 40 is preset at a predetermined length differing from that of the transmission line 45 described above (detail will be described later).

The J inverter transmission line 43 is composed of signal lines 21*c* and 21*d* having the line width W3 and the ground conductors 22 formed via the slits 23 having the gap G3. The signal lines 21*c* and 21*d* have end portions 26*a* and 26*b* formed into a shape of comb and facing to each other via a GAP having a predetermined gap d2.

The J inverter transmission line 43 of this sort may be represented by an equivalent circuit composed of a π-type circuit 43*a* of capacitor C and distributed constant lines 43*b* connected to the both ends of the π-type circuit 43*a* and having a line length of electrical length $\overline{\omega}/2$ as shown in FIG. 6B. It is noted that the end portions 26*a* and 26*b* and the gap d2 of the GAP are preset at predetermined shape and value, respectively, corresponding to the capacitor C described above.

Accordingly, as shown in FIG. 6B, the impedance matching circuit 7*b* may be represented by the π-type circuit 43*a* of the capacitor C, the distributed constant lines 43*b* connected to the both sides thereof and the distributed constant line 40*a* having a line length $L_{12}$ and a distributed constant line 45*a* having a line length $L_{F2}$ connected to the both sides of the distributed constant line 43*b*.

Because the J inverter transmission line 43 is composed of the π-type circuit 43*a* of the capacitor C and the distributed constant lines 43*b* connected to the both sides thereof as described above, the J inverter transmission line 43 functions as the J inverter as shown in FIG. 6C.

Figure 7A:
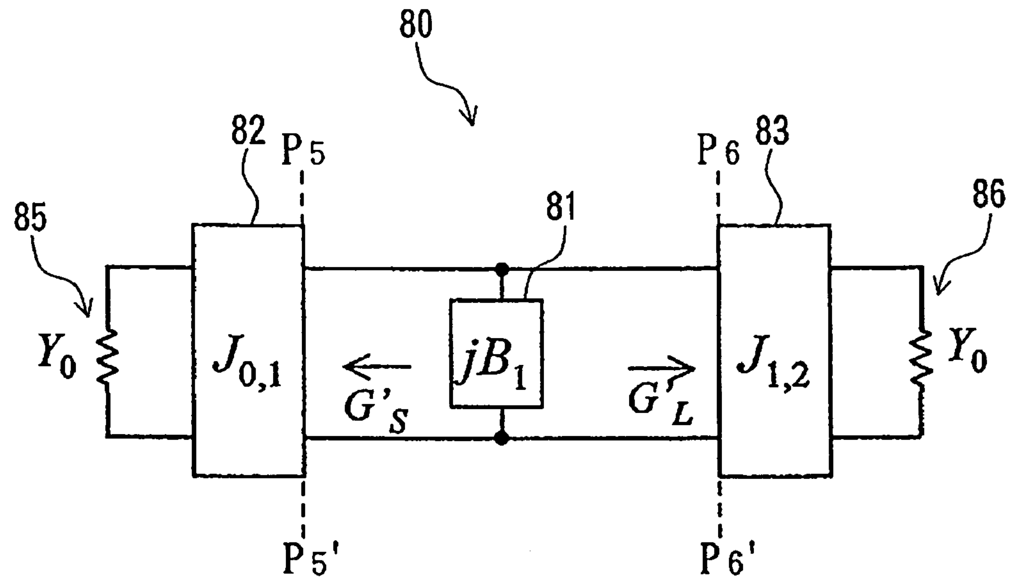
Figure 7B:
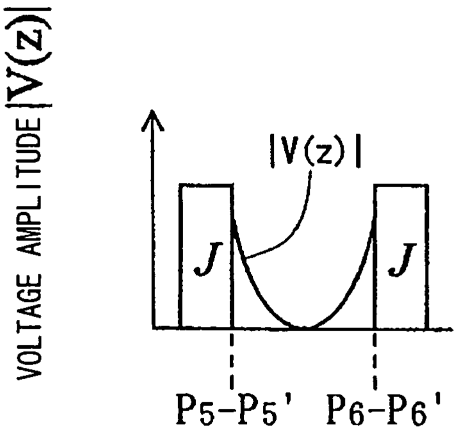
Figure 7C:
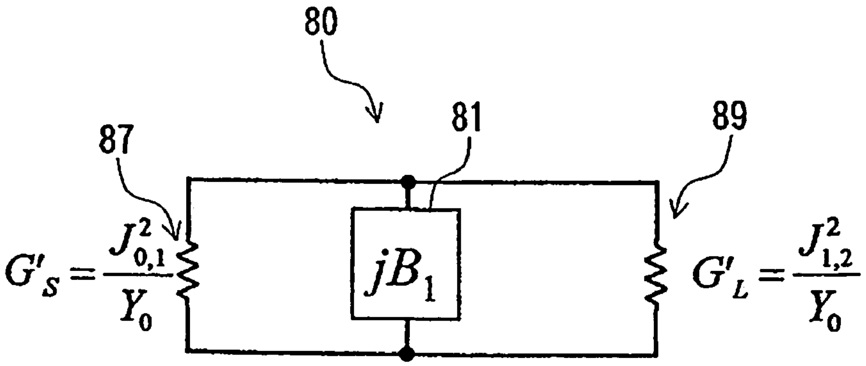

Here, a known filter 80 composed of the J inverters will be explained with reference to FIG. 7. FIGS. 7A, 7B and 7C are diagrams for explaining the filter 80 composed of the J inverters, wherein FIG. 7A is a circuit diagram of the filter 80, FIG. 7B shows voltage amplitude of a signal transmitting through the filter and FIG. 7C is an equivalent circuit of the filter 80.

Similarly to the filter 70 composed of the K inverters and explained in conjunction with FIG. 4, the filter 80 is a one-stage filter and is composed of a half-wave parallel resonator 81, a J inverter 82 denoted as $J_{0,1}$ and connected via terminals $P_5$-$P_5$' and a J inverter 83 denoted as $J_{1,2}$ and connected via terminals $P_6$-$P_6$' A load 85 denoted as $Y_0$ is connected to the J inverter and a load 86 denoted as $Y_0$ is connected to the J inverter 83. It is noted that conductance seen from the half-wave parallel resonator 81 to the J inverter 82 ($P_5$-$P_5$' side) is assumed to be $G_S$' and conductance seen from the half-wave parallel resonator to the J inverter 83 ($P_6$-$P_6$' side) to be $G_L$'.

Here, known design formulas for allowing the filter 80 to carry out the impedance matching and band adjustment may be expressed by Equations 22 and 23.

$$J_{0,1} = \sqrt{w}\sqrt{\frac{Y_0 b_1}{g_0 g_1}}$$ [Equation 22]

$$J_{1,2} = \sqrt{w}\sqrt{\frac{b_1 Y_0}{g_1 g_2}}$$ [Equation 23]

Where, $b_1$ denotes a slope parameter of susceptance $B_1$ and the susceptance $B_1$ may be expressed by Equation 24.

$$B_1 = b_1\left(\frac{\omega}{\omega_0} - \frac{\omega_0}{\omega}\right)$$ [Equation 24]

Because the half-wave parallel resonator 81 is constructed between the J inverters 82 and 83, the voltage amplitude |V(z)| of a signal transmitting through the half-wave parallel resonator 81 is open (amplitude is maximized) at the terminal sides $P_5$-$P_5$' and $P_6$-$P_6$' as shown in FIG. 7B. Still more, the filter 80 may be represented by an equivalent circuit in which conductances and 89 denoted as $G_S$' and $G_L$' are connected to the both sides of the half-wave parallel resonator 81. The conductances 87 and may be expressed by Equations 25 and 26.

$$G'_S = \frac{J_{0,1}^2}{Y_0}$$ [Equation 25]

$$G'_L = \frac{J_{1,2}^2}{Y_0}$$ [Equation 26]

Still more, Equations 27 and 28 hold in the half-wave parallel resonator 81.

$$\frac{G'_L}{G'_S} = \frac{g_0}{g_2}$$ [Equation 27]

$$Q = \frac{b_1}{G'_S + G'_L} = \frac{g_0 g_1 g_2}{w(g_0 + g_2)}$$ [Equation 28]

Thus, differing from the K inverter, the J inverters 82 and 83 invert admittance (half-wave parallel resonator 81) to impedance (half-wave serial resonator), so that the filter 80 is equivalent to the half-wave serial resonator not shown. Accordingly, the filter 80 functions as one-stage filter by the half-wave serial resonator and similarly to the filter 70 shown in FIG. 4, allows the impedance matching and band adjustment to be made by setting the specific bandwidth w based on Equations 23 and 24 described above.

Although the impedance matching circuit 7*b* of the invention meets with Equations 22 and 23 similarly to the impedance matching circuit 7*a* described above, the characteristic impedance $Z_{40}$ and the line length $L_{I2}$ of the impedance matching transmission line 40 are preset at predetermined values so that the occupation area can be reduced as compared to that of the filter 80.

Figure 8A:
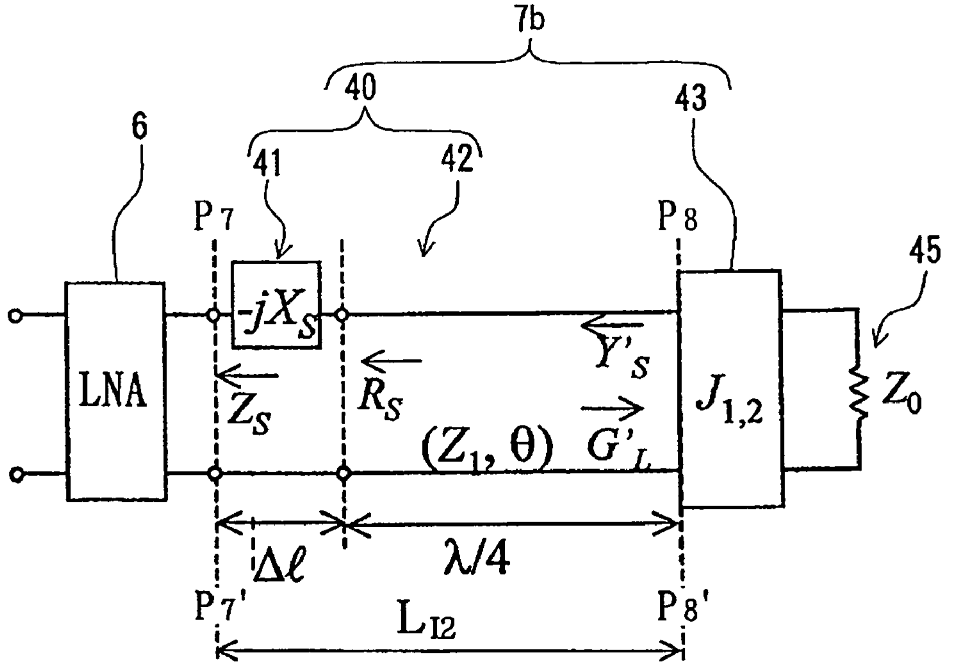
Figure 8B:
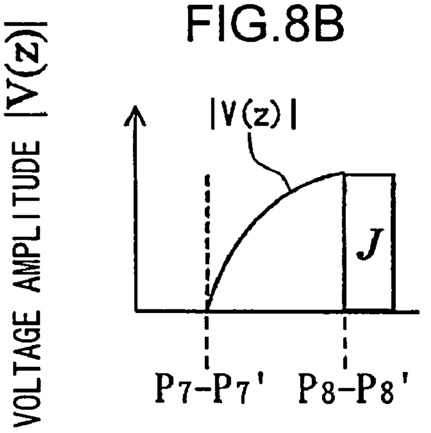
Figure 8C:
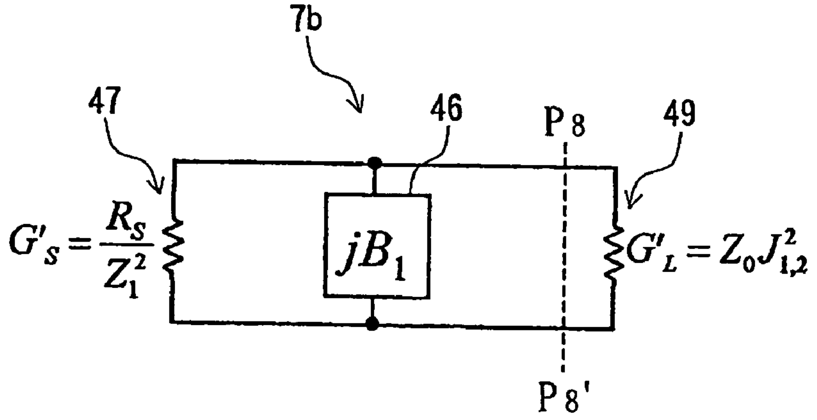

Next, the characteristic impedance $Z_{40}$ and the line length $L_{12}$ will be explained with reference to FIGS. 8A through 8C. FIGS. 8A, 8B and 8C are diagrams for explaining the characteristic impedance $Z_{40}$ and the line length $L_{I2}$ of the impedance matching circuit 7B connected to the output terminals of the low noise amplifier 6, wherein FIG. 8A is a circuit diagram of the impedance matching circuit 7*b*, FIG. 8B shows voltage amplitude of a signal transmitting through the impedance matching circuit 7*b* and FIG. 8C is an equivalent circuit of the impedance matching circuit 7*b*.

The impedance matching circuit 7*b* shown in FIG. 8A is composed of the impedance matching transmission line 40 and the J inverter transmission line 43 as explained in connection with FIG. 6. The impedance matching transmission line 40 is composed of the quarter-wave transmission line (quarter-wave distributed constant line) 42 having characteristic impedance $Z_1$ and the reactance compensating transmission line (reactance compensating distributed constant line) 41 connected with the quarter-wave transmission line 42. The line length of the quarter-wave transmission line 42 is quarter wavelength λ/4 similarly to the quarter-wave transmission line 32 (see FIG. 5A). The quarter-wave transmission line 42 is connected with the J inverter transmission line 43 via input terminals $P_8$-$P_8$' and the J inverter transmission line 43 is connected with the transmission line 45. Still more, the reactance compensating transmission line 41 is connected with the low noise amplifier 6 (see FIG. 1) via output terminals $P_7$-$P_7$'.

Thus, the line length of the quarter-wave transmission line 42 is preset at a half of a half-wave transmission line (not shown) composing the half-wave parallel resonator 81 of the filter 80 explained in connection with FIG. 4A similarly to the line length of the quarter-wave transmission line 32 (see FIG. 5A). Still more, because the output impedance (impedance of load) of the low noise amplifier 6 is very small as compared to the input impedance $Z_L$ described above, the low noise amplifier 6 may be handled as shorted and the two J inverters are not necessary. Then, the J inverter transmission line 43 composes the J inverter (inverter of the impedance inverting circuit) $J_{1,2}$ only on the input terminal side $P_8$-$P_8$'. That is, voltage amplitude |V(z)| of a signal transmitting through the quarter-wave transmission line 42 becomes as shown in FIG. 8B. It is a quarter-wave, is opened (amplitude is maximized) on the input terminal side $P_8$-$P_8$' and is short (|V(z)|=0) on the output terminal side $P_7$-$P_7$'.

In order to apply Equations 23 and 24 described above while thus setting the line length of the quarter-wave transmission line 42 at quarter wavelength λ/4, the line length of the reactance compensating transmission line 41 is set at adjusted length Δl so as to compensate (cancel) reactance (reactance of load) $X_S$ of the low noise amplifier 6.

Here, the output impedance $Z_S$ of the low noise amplifier 6 will be defined as Equation 29. Where, Rs is resistance of the output impedance $Z_S$ and $X_S$ is reactance of the output impedance $Z_S$.

$$Z_S=R_S+jX_S \quad \text{[Equation 29]}$$

Because the output impedance $Z_S$ of the low noise amplifier 6 is very small as compared to the input impedance $Z_L$ described above, $|Z_S|<<Z_0$ and the output terminals $P_7$-$P_7$' may be handled as shorted. Accordingly, because the quarter-wave transmission line 42 can increase/decrease the reactance by adjusting the increase/decrease of its line length (quarter wavelength λ/4) similarly to the reactance compensating distributed constant line 31 (see FIG. 5A), the adjusted length Δl of the reactance compensating transmission line 41 is preset so as to meet with Equation 30. Where, L is inductance H/m per unit length.

$$\omega_0 L\Delta l=X_S \quad \text{[Equation 30]}$$

Accordingly, the adjusted length Δl of the reactance compensating transmission line 41 may be represented by a length meeting with Equation 31.

$$\Delta l = \frac{X_S}{\omega_0 L} \quad \text{[Equation 31]}$$

It is noted that the output impedance $Z_S$ of the low noise amplifier 6 is $X_S<0$ similarly to the input impedance $Z_L$ and Δl<0 from Equation 31. Meanwhile, because the line length of the quarter-wave transmission line 42 is quarter wavelength λ/4 and the line length of the reactance compensating transmission line 41 is the adjusted length Δl, the line length $L_{l2}$ of the impedance matching transmission line 40 is λ/4+Δl as shown in FIG. 8A. Accordingly, the line length $L_{12}$ of the impedance matching transmission line 40 is the length obtained by subtracting an absolute value of the adjusted length Δl of the reactance compensating transmission line 41 from the line length (quarter wavelength λ/4) of the quarter-wave transmission line 42 similarly to the line length $L_{l1}$ of the impedance matching transmission line 30.

Admittance $Y_S$' seen from the input terminals $P_8$-$P_8$' to the impedance matching transmission line 40 side may be expressed by Equation 32, and Equation 33 or 36 holds.

$$Y_S' = \frac{R_S}{Z_1^2} + jB_1 \equiv G_S' + jB_S' \quad \text{[Equation 32]}$$

$$B_1 = -Y_1\cot\theta \equiv -b_1\left(\frac{\omega}{\omega_0} - \frac{\omega_0}{\omega}\right) \quad \text{[Equation 33]}$$

$$b_1 = \frac{\pi}{4}Y_1 \quad \text{[Equation 34]}$$

$$G_S' = \frac{R_S}{Z_1^2} \quad \text{[Equation 35]}$$

$$G_L' = Z_0 J_{1,2}^2 \quad \text{[Equation 36]}$$

When an inverse number of the characteristic impedance $Z_1$ of the quarter-wave transmission line 42 is assumed to be admittance (characteristic impedance corresponding to preset bandwidth) $Y_1$, the design formula represented by Equation 22 may be expressed by Equation 37 as the admittance $Y_1$ of the quarter-wave transmission line 42 from Equations 22, 25, 34 and 35. Still more, the design formula represented by Equation 23 may be expressed by Equation 38 as the J inverter (inverter of the impedance inverting circuit) composed of the J inverter transmission line 43.

$$Y_1 = \frac{\pi}{4}\frac{w}{g_1 g_2 R_S} \quad \text{[Equation 37]}$$

$$J_{1,2} = \sqrt{w}\sqrt{\frac{b_1 Y_0}{g_0 g_1}} \quad \text{[Equation 38]}$$

Because the impedance matching transmission line 40 is constructed with the line width W3 and the gap G3 as explained in FIG. 6A and is composed of the reactance compensating transmission line 41 and the quarter-wave transmission line 42 as explained in FIG. 8A, the characteristic impedance $Z_{40}$ of the impedance matching transmission line 40 described above may be expressed by impedance based on the admittance $Y_1$ described above.

Because Equations 37 and 38 are met, the circuit diagram of the impedance matching circuit 7*b* shown in FIG. 8A may be expressed by an equivalent circuit seen from the half-wave parallel resonator as shown in FIG. 5C similarly to the equivalent circuit shown in FIG. 7C. That is, the impedance matching circuit 7*b* may be expressed by the equivalent circuit in which conductances 47 and denoted as $G_S$' and $G_L$' are connected to the both sides of the half-wave parallel resonator 46. The conductances 47 and 49 may be expressed by Equation 39 from Equations 27, 35 and 36. The quality factor Q may be expressed by Equation 40 from Equations 28, 35 and 36.

$$\frac{G_L'}{G_S'} = \frac{Z_0}{R_S}Z_1^2 J_{1,2}^2 = \frac{g_0}{g_1} \quad \text{[Equation 39]}$$

$$Q = \frac{b_1}{G_S' + G_L'} = \frac{Z_1^2}{R_S}\frac{b_1}{\left(1+\frac{g_0}{g_2}\right)} = \frac{g_0 g_1 g_2}{w(g_0+g_2)} \quad \text{[Equation 40]}$$

Accordingly, the impedance matching circuit 7*b* is equivalent to the half-wave serial resonator not shown similarly to the filter 80 shown in FIG. 7, functions as one-stage filter by the half-wave serial resonator and similarly to the impedance matching circuit 7*b* described above, allows the impedance matching and bandwidth adjustment to be made based on Equations 37 and 38.

Still more, because the input impedance of the power amplifier 5 shown in FIG. 1 is also relatively large and the output impedance is relative small load similarly to the low noise amplifier 6, the present invention is applicable to the impedance matching circuits 7*c* and 7*d* connected respectively to the input and output terminals of the power amplifier 5. It is noted that the impedance matching circuit 7*c* has the same structure with what the right and left sides of the impedance matching circuit 7*a* shown in FIG. 3 are reversed in FIGS. 3 and 5 and the impedance matching circuit 7*d* has the same structure with what the right and left sides of the impedance matching circuit 7*b* shown in FIG. 6 are reversed in FIGS. 6 and 8, so that their explanation will be omitted here.

Still more, although the power amplifier 5 and the low noise amplifier 6 have been shown as examples of the loads, the invention is applicable also to loads such as the phase shifters 10*a* and 10*b*, the mixers 11*a* through 11*d* and the voltage controlled oscillator not shown of the phase lock loop 9 held in the RF circuit 2*a* (see FIG. 1). Still more, the load is not limited to be capacitive load and may be inductive load. In such a case, the adjusted length Δl becomes positive, so that the line lengths $L_{T1}$ and $L_{T2}$ of the impedance matching transmission lines 30 and 40 may be configured as a sum of the line length (quarter wavelength λ/4) of the quarter-wave transmission lines 32 and 42 and the absolute value of the adjusted length Δl of the reactance compensating transmission lines 31 and 41.

The impedance matching described above is not limited to matching for maximizing electric power but is applicable to matching corresponding to impedance that minimizes noise index. It is noted that in the present embodiment, the impedance matching for the power amplifier 5 is that of maximizing electric power and the impedance matching for the low noise amplifier 6 is that of minimizing the noise index. The structure of the impedance matching circuit 7*d* is the same with what the right and left sides of the impedance matching circuit 7*c* shown in FIG. 8 are reversed in FIGS. 6 and 8, so that its explanation will be omitted here.

Next, actions of the impedance matching circuit 7 of the invention as well as of the semiconductor element 2 and the radio communication device 1 using the same will be explained with reference to FIG. 1. It is noted that in the present embodiment, a case of making speech communications through the radio communication device 1 described above as mobile communication means having speech transmitting means of a microphone and speech receiving means of a speaker will be explained.

When an operator makes speech communication by using the radio communication device 1 for example, the operator inputs a start command through starting means (not shown) provided in the radio communication device 1 to start the radio communication device 1. Further, when the operator inputs a connect command through input means (not shown) provided in the radio communication device 1, the radio communication device 1 is connected with another radio communication device 1' (not shown) so as to be able to transmit/receive speech signals through a public line or a network.

When the operator inputs a speech signal to the radio communication device 1 through a microphone not shown in this state, the speech signal is inputted to a DSP (not shown). The DSP carries out predetermined digital processing such as coding to the inputted speech signal and then outputs it as an input signal SI1 to the digital signal processing circuit 2*c* of the semiconductor element 2 shown in FIG. 1. The digital modulator 18 in the digital signal processing circuit 2*c* carries out predetermined digital processing to the input signal SI1 and then divides the input signal SI1 bit by bit to input to the A/D converter circuit 2*b*.

The DA converters 16*a* and 16*b* of the A/D converter circuit 2*b* convert the divided input signal SI1 into analog signals and output respectively to the low-pass filters 13*c* and 13*d*. The low-pass filters 13*c* and 13*d* remove high-harmonic component of the input signal SI1 and output the input signal SI1 to the mixers 11*c* and 11*d* of the RF circuit 2*a*. Meanwhile, the phase lock loop 9 in the RF circuit 2*a* outputs a carrier signal of carrier frequency (2.45 GHz) to the phase shifter 10*b* and the phase shifter 10*b* outputs the carrier signals whose phase are different by 90° from each other to the mixers 11*c* and 11*d*. The mixers 11*c* and 11*d* combine the input signal SI1 with the carrier signals and output to the power amplifier 5 via the impedance matching circuit 7*c* in a manner of orthogonal modulation.

Because the impedance matching circuits 7*c* and 7*d* are set so as to carry out the impedance matching of maximizing electric power as described above, the electric power of the input signal SI1 is amplified to a predetermined value by the power amplifier 5 while minimizing its loss and is outputted via the impedance matching circuit 7*d*. Still more, because the predetermined bandwidth is preset by the specific bandwidth w in Equations 37 and 38, the input signal SI1 corresponding to the specific bandwidth w is inputted to the antenna 3 via the switch 12. Then, the antenna 3 radiates the input signal SI1 while fully amplifying its electric power as an output signal SO1 through electromagnetic wave. Thus, the output signal SO1 is transmitted to the other radio communication device 1' via the public line or the network.

When the antenna 3 receives an input signal SI2 from the other radio communication device 1', the input signal SI2 is outputted to the impedance matching circuit 7*a* via the switch 12. Because the impedance matching circuits 7*a* and 7*b* are set so as to carry out the impedance matching of minimizing noise index, the input signal SI2 is amplified to a predetermined value by the low noise amplifier 6 while minimizing noise and is outputted via the impedance matching circuit 7*b*. Still more, because the predetermined bandwidth is preset by the specific bandwidth w in Equations 18 and 19 similarly as described above, the input signal SI2 corresponding to the specific bandwidth w is bifurcated and inputted to the mixers 11*a* and 11*b*.

Meanwhile, the phase lock loop 9 outputs the carrier signal also to the phase shifter 10*a*, similarly to the phase shifter 10*b*, and the phase shifter 10*a* outputs the carrier signals whose phase differs by 90° from each other to the mixers 11*a* and 11*b*. The mixers 11*a* and 11*b* combines the input signal SI2 with the carrier signals described above and in a manner of orthogonal demodulation, output to the low-pass filters 13*a* and 13*b* as an I-axis base band signal and a Q-axis base band signal, respectively. The low-pass filters 13*a* and 13*b* remove high-harmonic component of the I-axis base band signal and Q-axis base band signal and output them to the variable gain amplifiers 14*a* and 14*b*. The variable gain amplifiers 14*a* and 14*b* boost attenuated signal level of the I-axis base band signal and Q-axis base band signal and output them to the AD converters 15*a* and 15*b*. The AD converters 15*a* and 15*b* convert the inputted I-axis base band signal and Q-axis base band signal into digital signals and output them to the digital demodulator 17 of the digital signal processing circuit 2*c*. The digital demodulator 17 carries out predetermined digital demodulation to the I-axis base band signal and Q-axis base band signal and outputs to the DSP not shown as an output signal SO2. Then, the DSP carries out predetermined digital processing such as decoding to the inputted output signal SO2 and outputs the output signal SO2 to the speaker. Because the impedance matching of minimizing the noise index is carried out, the output signal SO2 is outputted from the speaker as a speech signal having a good sound quality.

As described above, because the impedance matching circuit 7 of the invention can be configured by one inverter and so as to have the line length of λ/4+Δl while allowing the impedance matching and bandwidth adjustment to be carried out, its occupation area may be reduced to a relatively small one. It allows the semiconductor element 2 to be made by the SOC (System On a Chip) of realizing the whole system by one chip and the semiconductor element 2 and the radio communication device 1 to be downsized and their cost to be reduced.

Figure 9:
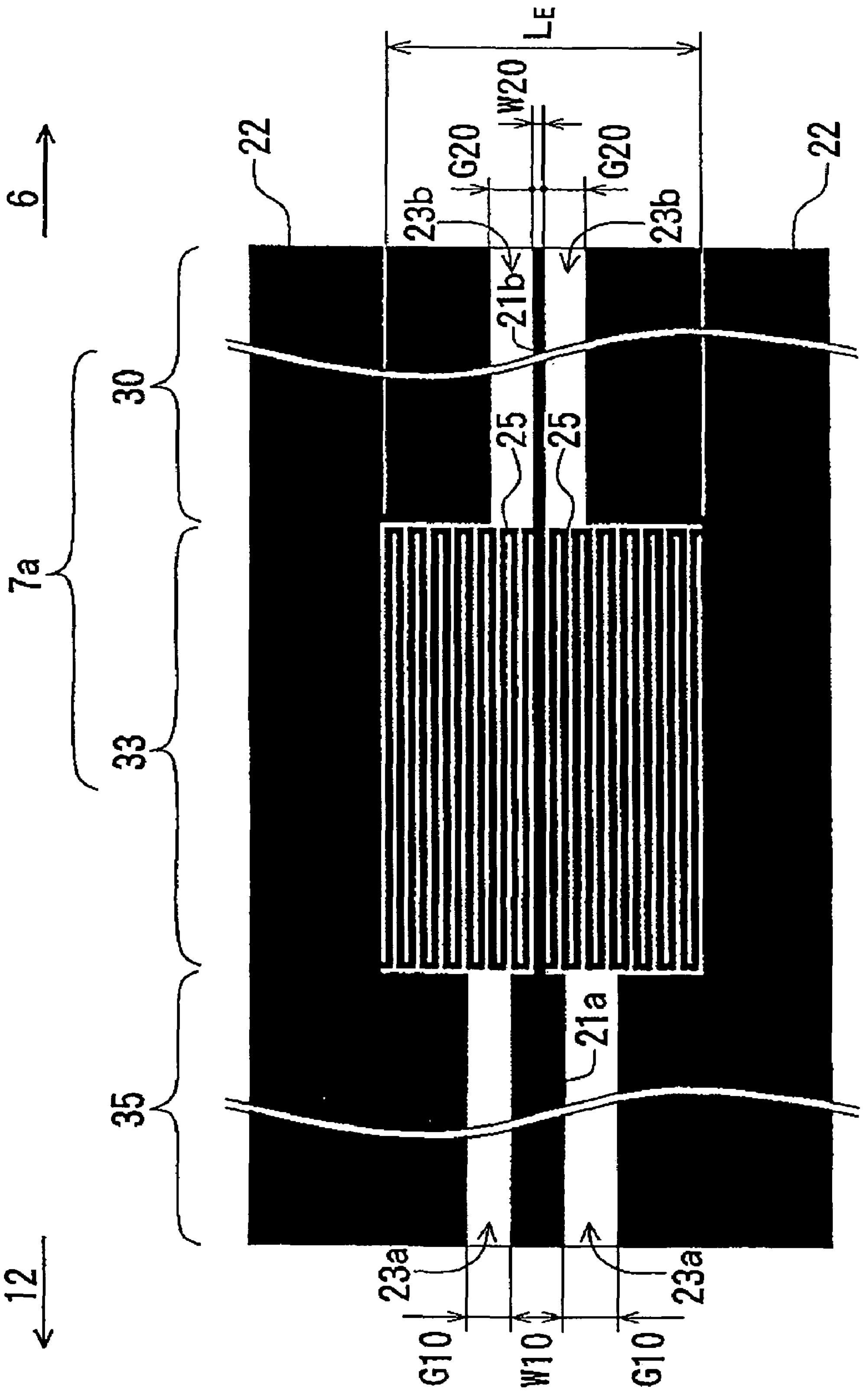
FIG. 9 is a (partially cut away) top plan view of the transmission line of the impedance matching circuit when width of the transmission line is narrowed.

It is noted that the impedance matching transmission lines 30 and 40 of the impedance matching circuit 7 need not be straight as shown in FIGS. 3A and 6A and may be formed in meander to downsize further. In this case, the occupation area of the impedance matching circuit 7 may be reduced further by narrowing the width of the transmission line. FIG. 9 is a (partially cut away) top plan view of the transmission line of the impedance matching circuit 7*a* when the width of the transmission line is narrowed.

As shown in FIG. 9, a line width W10 and a gap G10 of the transmission line 35 are narrowed while keeping the same ratio with that of the line width W1 and the gap G1 of the transmission line 35 explained in FIG. 3. Accordingly, characteristic impedance $Z_{35}$ of the transmission line 35 is kept at $Z_0$ while narrowing the width of the transmission line.

Similarly to that, a line width W20 and a gap G20 of the impedance matching transmission line 30 are narrowed while keeping the same ratio with that of the line width W2 and the gap G2 of the impedance matching transmission line 30 explained in FIG. 3. Accordingly, characteristic impedance $Z_{30}$ of the impedance matching transmission line 30 is kept at a predetermined value (83.4Ω similarly as described above) while narrowing the width of the transmission line.

It is noted that because the stabs 25 are preset at predetermined line length to construct the inductance L of the K inverter (see FIG. 3B) as described above, a distance between the ground conductors 22 in the K inverter transmission line 33 is limited to be a ground conductor distance $L_E$ shown in FIG. 9. In FIG. 9, the same parts with those explained in FIG. 3A will be denoted by the same reference numerals and their explanation will be omitted here.

Figure 10A:
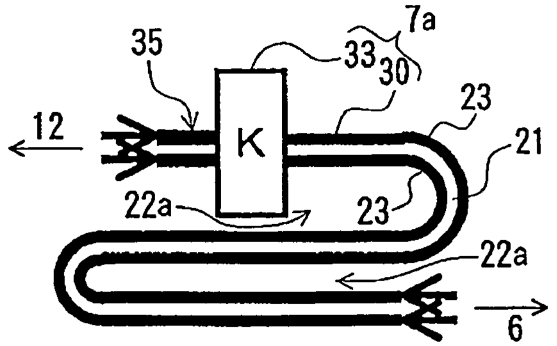
Figure 10B:
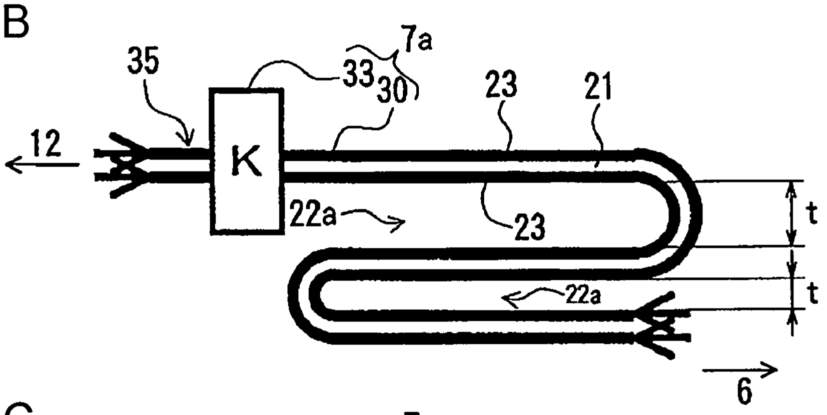
Figure 10C:
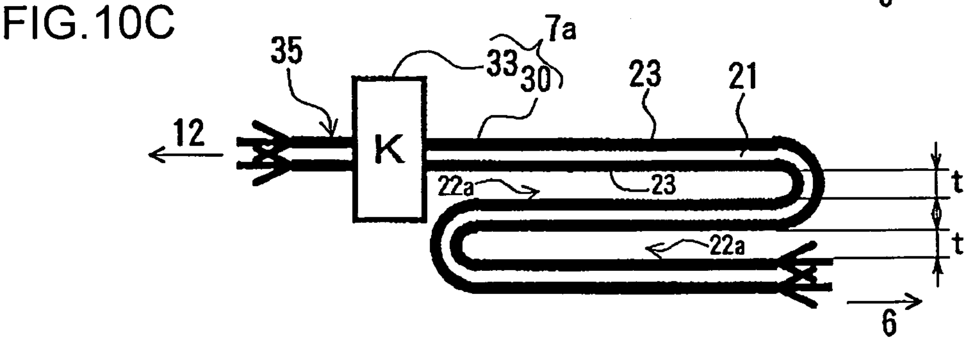
Figure 10D:
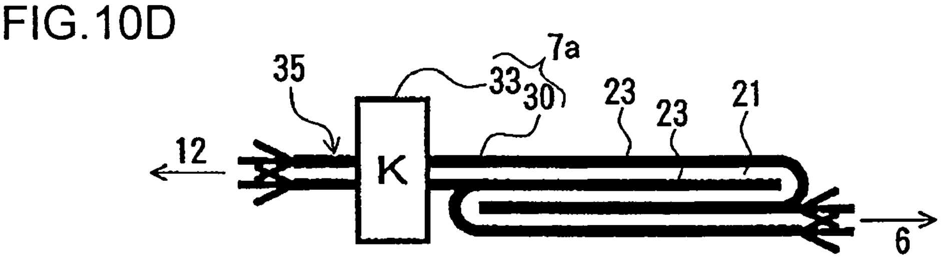
Figure 10E:
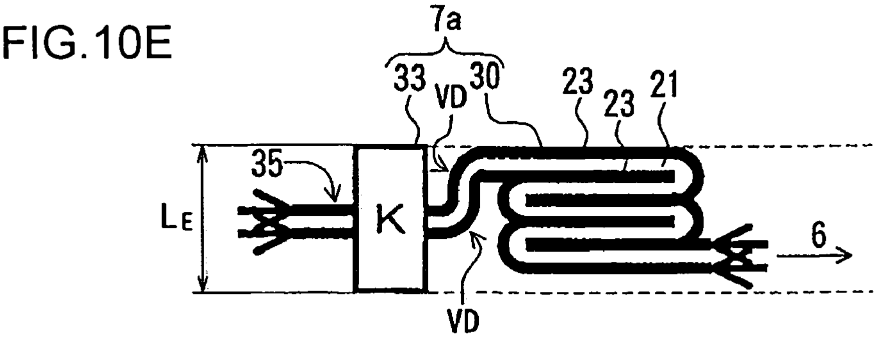

Next, the impedance matching transmission line 30 in which the transmission line whose width is narrowed is formed in meander while keeping the characteristic impedance will be explained with reference to FIGS. 10A through 1E. FIGS. 10A through 10E are schematic diagrams of the impedance matching circuit 7*a* represented by equivalent circuits using the K inverter, wherein FIG. 10A shows a case when the transmission line is formed in meander, FIG. 10B shows a case when the transmission line is disposed adjacent to the K inverter, FIG. 10C shows a case when a width of the ground conductor is narrowed, FIG. 10D shows a case when the adjacent ground conductors are removed and FIG. 10E shows a case when the transmission line is formed within the ground conductor distance.

In the impedance matching circuit 7*a* shown in FIG. 1A, the straight impedance matching transmission line 30 explained in FIG. 3C is formed in meander such that the signal line (white line) 21 turns its direction to the right and left within the figure together with the slits (black line) 23. Because the signal line 21 is formed so as to be adjacent to each other via the slit 23, the ground conductor 22*a* and the slit 23, an area occupied by the ground conductor 22*a* in the impedance matching circuit 7*a* may be reduced.

In the impedance matching circuit 7*a* shown in FIG. 10B, the impedance matching transmission line 30 formed in meander is disposed between the K inverter transmission line 33 and the low noise amplifier 6.

In the impedance matching circuit 7*a* shown in FIG. 10C, a width t of the ground conductor 22*a* is narrowed more than a width t of the ground conductor shown in FIG. 10B. It enables an area occupied by the ground conductor 22*a* in the impedance matching circuit 7*a* may be reduced further.

In the impedance matching circuit 7*a* shown in FIG. 10D, the width t of the ground conductor is equalized with the gap G (not shown) of the slit 23 and the signal lines 21 are formed so as to adjacent to each other only through the slit 23, so that an area occupied by the ground conductor 22*a* in the impedance matching circuit 7*a* may be reduced further.

In the impedance matching circuit 7*a* shown in FIG. 10E, bent portions VD are provided in the impedance matching transmission line 30 on the side of the K inverter transmission line 33 to construct the impedance matching transmission line 30 within the range of the ground conductor distance $L_E$ (within the broken lines).

Since the line lengths $L_{11}$ and $L_{12}$ of the impedance matching transmission lines 30 and 40 may be formed in compact by configuring the impedance matching circuit 7 as described above, the impedance matching transmission lines 30 and 40 may be miniaturized and the area occupied by the impedance matching circuit 7 in the semiconductor element 2 may be reduced further.

It is noted that although the signal line 21 has been formed in meander by turning its direction to the right and left in the figure to miniaturize the impedance matching transmission line 30, its shape is not limited to that as long as it narrows the gaps of the signal lines 21. For instance, the signal line 21 may be formed in meander by turning its direction in the vertical direction in the figure. Still more, although the miniaturization of the impedance matching transmission line is also applicable to the impedance matching circuits 7*b*, 7*c* and 7*d*, its explanation will be omitted here.

Figure 11A:
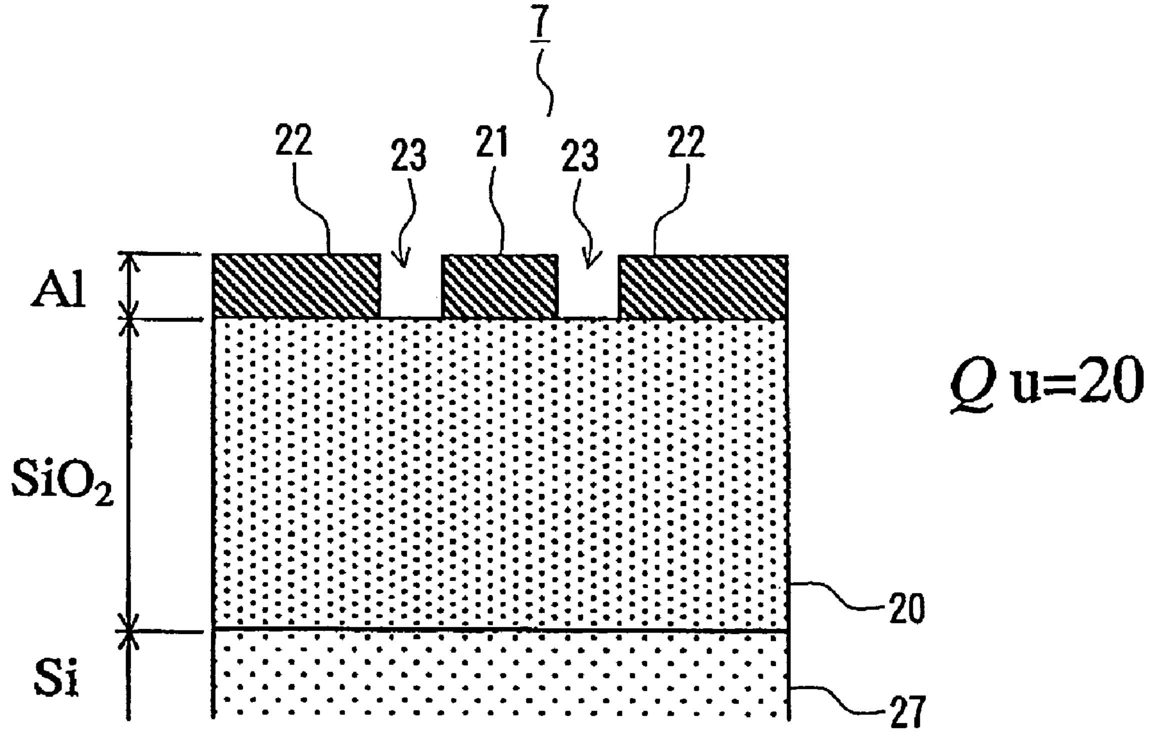
Figure 11B:
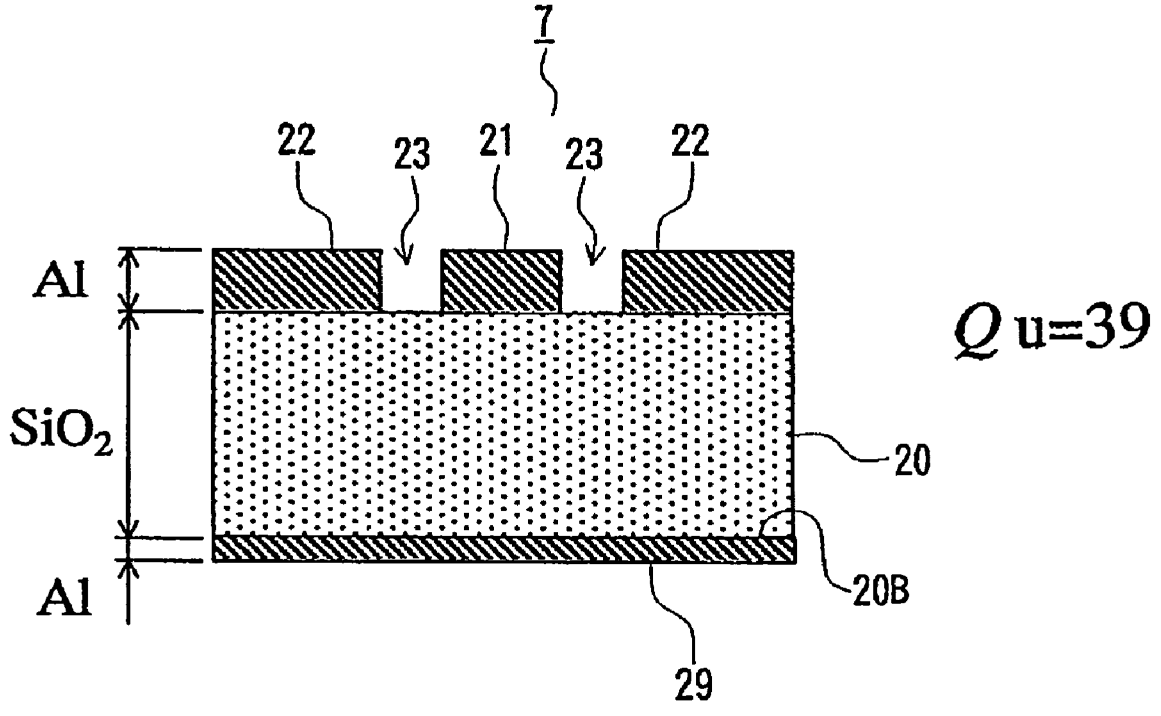

Although the impedance matching circuit 7 permits the impedance transmission lines 30 and 40 to be miniaturized while keeping the ratio of the line width W and the gap D constant, a signal insertion loss may increase in some cases as the line width W is reduced. It is then possible to provide a ground layer 29 described later to improve the quality factor Q of the impedance matching circuit 7. FIGS. 11A and 11B are (partially cut away) section views of the impedance matching circuit 7, wherein FIG. 11A shows a case when a silicon substrate 27 is formed on the back 20B of the dielectric substrate 20 and FIG. 11B shows a case when the ground layer 29 is formed on the back 20B of the dielectric substrate 20.

It is noted that FIGS. 11A and 11B are section views when the impedance matching circuit 7 shown in FIG. 2 is seen from the direction A and which shows the impedance matching circuit 7 in a simplified manner so that electromagnetic simulations described later can be made. A passivation film to be formed on the signal line 21 and the ground conductors 22 is omitted here.

In the impedance matching circuit 7 shown in FIG. 11A, an oxide layer made from silicon dioxide ($SiO_2$) and that functions as the dielectric substrate 20 is formed on the silicon substrate 27 made from silicon (Si). The signal line 21 made from aluminum (Al) and the ground conductors 22 made from aluminum (Al) formed on the both sides of the signal line 21 via the slits 23 are formed on the dielectric substrate 20.

Meanwhile, in the impedance matching circuit 7 shown in FIG. 11B, the signal line 21 made from aluminum (Al) and the ground conductors 22 made from aluminum (Al) formed on the both sides of the signal line 21 via the slits 23 are formed on the dielectric substrate 20 made from silicon dioxide ($SiO_2$) similarly to the impedance matching circuit 7 shown in FIG. 11A. However, differing from the impedance matching circuit 7 shown in FIG. 11A, the ground layer 29 made from aluminum (Al) which conducts with the ground conductors 22 described above is formed on the back (the other face of the dielectric substrate) 20B of the dielectric substrate 20.

When the quality factor Q (unloaded Qu) of the impedance matching circuit 7 shown in FIGS. 11A and 11B is calculated based on predetermined electromagnetic simulations, while Qu of the impedance matching circuit 7 shown in FIG. 11A is '20', Qu of the impedance matching circuit 7 shown in FIG. 11B is '39'. That is, the quality factor Q of the impedance matching circuit 7 may be improved by forming the ground layer 29 on the back (the other side of the dielectric substrate) 20B of the dielectric substrate 20 without forming the silicon (Si) having a large resistance.

It is noted that the conditions of the electromagnetic simulation conform to IEEE (Institute of Electrical and Electronic Engineers) 802.11b, which is the standard of, radio LAN. The center frequency $\omega_0$ is 2.45 GHz. The same also applies to conditions of the electromagnetic simulations in the following explanation.

Figure 12A:
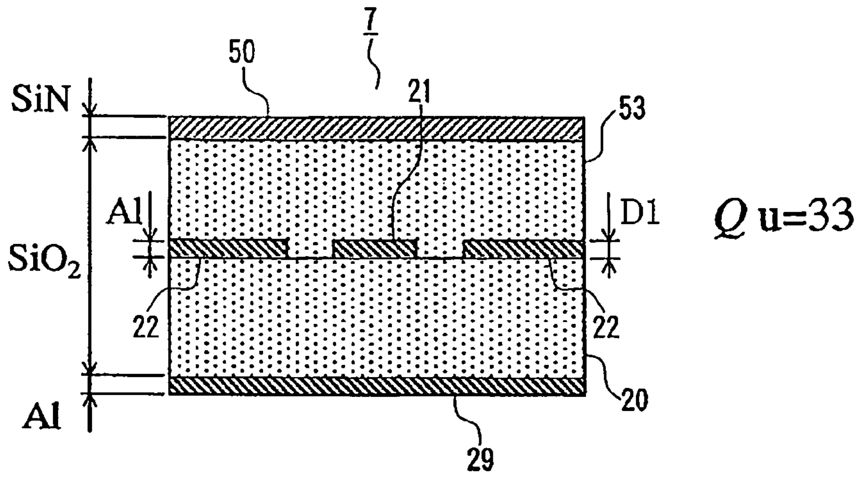
FIGS. 12A, 12B and 12C are (partially cut away) section views of the impedance matching circuit when the thickness of the transmission line is increased.
Figure 12B:
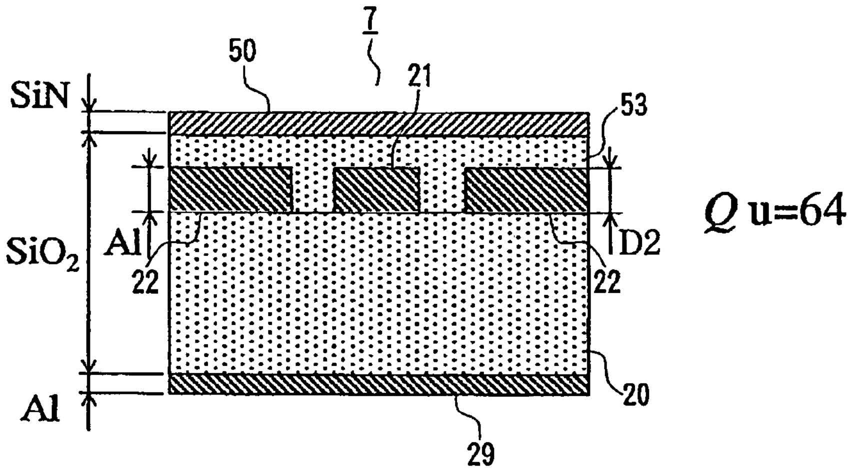
Figure 12C:
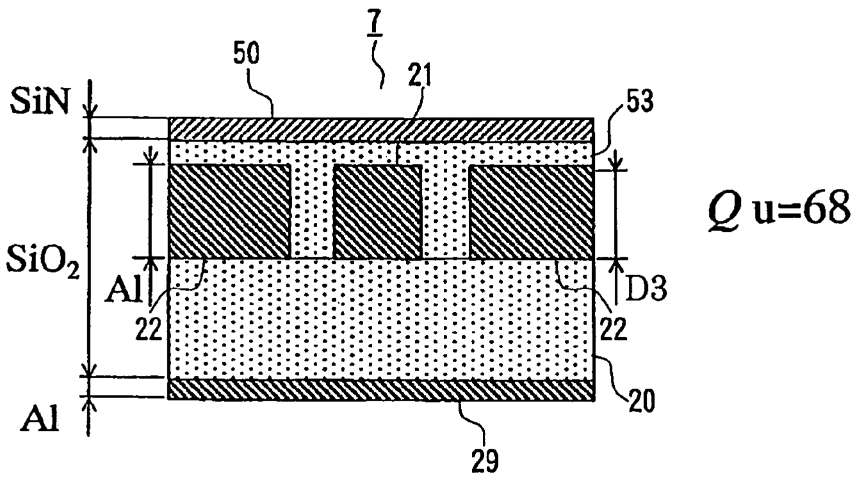

It is also possible to improve the quality factor Q by not only forming the ground layer 29 on the back 20B of the dielectric substrate 20 but also by increasing the thickness D of the transmission line. FIGS. 12A, 12B and 12C are (partially cutaway) section views of the impedance matching circuit 7 when the thickness D of the transmission line is increased. It is noted that FIGS. 12A through 12C are section views seen from the direction A shown in FIG. 2 similarly to FIG. 11 and the impedance matching circuit 7 is simplified so as to allow the electromagnetic simulation thereof.

The impedance matching circuit 7 shown in FIGS. 12A, 12B and 12C is provided with the ground layer 29 formed on the back 20B of the dielectric substrate 20 similarly to the impedance matching circuit 7 explained in FIG. 11B. An oxide layer 53 made from silicon dioxide ($SiO_2$) is formed on the signal line 21 and the ground conductor 22 and a nitride layer 50 made from silicon nitride (SiN) is formed further on the oxide layer 53. The transmission line of the signal line 21 and the ground conductor 22 are formed so that their thickness D is $D_1<D_2<D_3$ in order of FIGS. 12A, 12B and 12C.

When the quality factor (unloaded Qu) of the impedance matching circuit 7 is calculated based on the electromagnetic simulation similarly as described above, Qu becomes '33', '64' and '68' in the order of FIGS. 12A, 12B and 12C. That is, the quality factor Q of the impedance matching circuit 7 may be improved by increasing the thickness D of the signal line 21 and the ground conductor 22.

Figure 13:
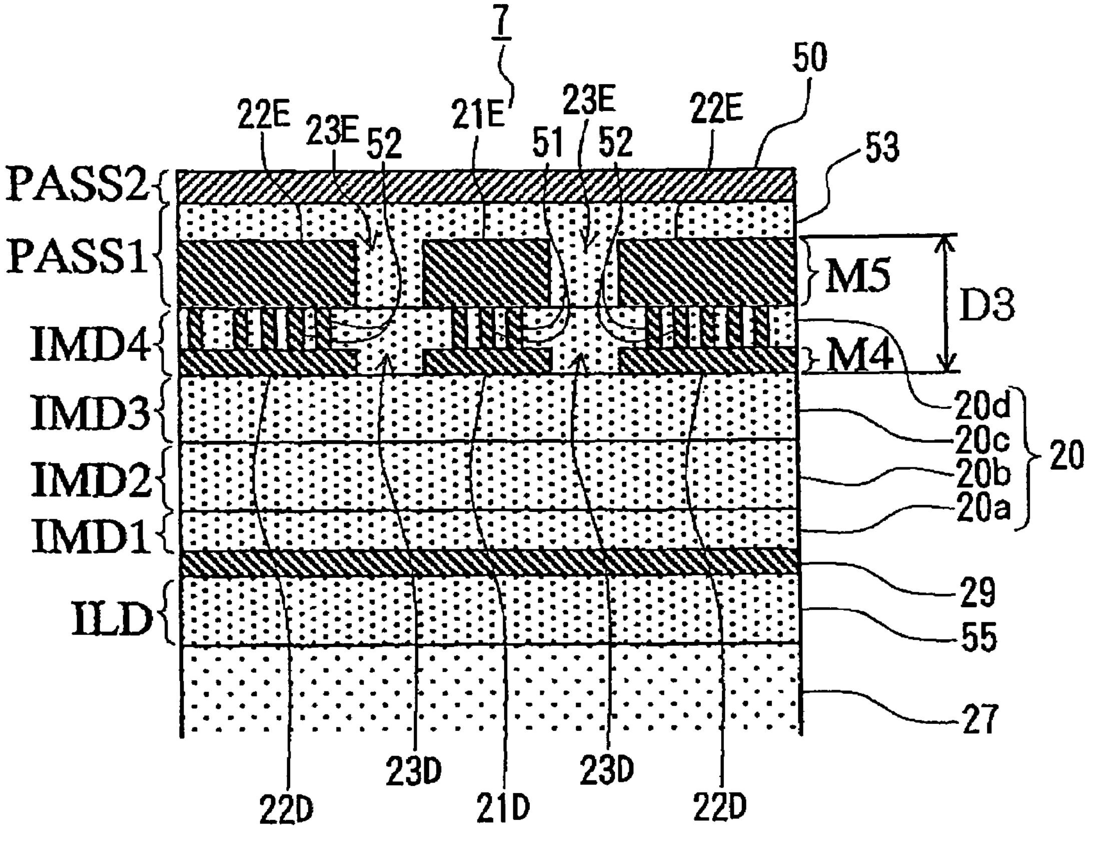
FIG. 13 is a (partially cut away) section view of the impedance matching circuit when its thickness is increased by laminating dielectric layers.

One example of the impedance matching circuit 7 shown in FIG. 12C and constructed by laminating dielectric layers will be explained with reference to FIG. 13. FIG. 13 is a (partially cut away) section view of the impedance matching circuit 7 when the thickness D is increased by laminating dielectric layers 20*a*, 20*b*, 20*c* and 20*d*. It is noted that FIG. 13 is a section view seen from the direction A shown in FIG. 2 similarly to FIGS. 11 and 12.

As shown in FIG. 13, an oxide layer (ILD) 55 made from silicon dioxide ($SiO_2$) is formed on the silicon substrate 27 made from silicon (Si) and the dielectric substrate 20 is formed on the oxide layer 55 through an intermediary of the ground layer 29. The dielectric substrate 20 is composed of four layers of a first dielectric layer (IMD1) 20*a*, a second dielectric layer (IMD2) 20*b*, a third dielectric layer (IMD3) and a fourth dielectric layer (IMD4) 20*d* based on a design rule (e.g., 0.25 μm process) of TSMC (registered trade mark) which is equivalent to the international standard in the semiconductor manufacturing process.

A fourth metal layer (M4) having a signal line (signal layer) 21D made from aluminum (Al) and ground conductors (ground conductor layers) 22D made from aluminum (Al) formed on the both sides of the signal line 21D via slits 23D is formed on the third dielectric layer 20*c*. Similarly to that, a fifth metal layer (M5) having a signal line (signal layer) 21E made from aluminum (Al) and ground conductors (ground conductor layers) 22E made from aluminum (Al) formed on the both sides of the signal line 21E via slits 23E is formed on the fourth dielectric layer 20*d*. Still more, an oxide layer (PASS1) 53 made from silicon dioxide ($SiO_2$) is formed on the fifth metal layer and a nitride layer (PASS2) 50 made from silicon nitride (SiN) is formed on the oxide layer 53.

The signal lines 21D and 21E and the ground conductors 22D and 22E in the fourth and fifth metal layers are disposed so as to overlap vertically in the figure and a plurality of vias 51 and 52 having a predetermined diameter is formed through the fourth dielectric layer 20*d*. That is, the signal line 21D in the fourth metal layer conducts with the signal line 21E in the fifth metal layer through the vias (inter layer conducting means, inter layer conducting lines) 51. Similarly to that, the ground conductors 22D in the fourth metal layer conduct with the ground conductors 22E in the fifth metal layer through the vias (inter layer conducting means, inter layer conducting lines) 52. Thereby, the transmission lines are formed so as to have the thickness D shown in FIG. 12C.

The semiconductor manufacturing process is provided with a preset design rule that specifies line width, thickness and others of the transmission lines constructed on the semiconductor element 2. Accordingly, even if the thickness D of the transmission line per one layer is limited due to such design rule, the thickness D may be increased and the quality factor Q may be improved as described above without any problem. Thereby, the impedance matching circuit 7 may be constructed on the semiconductor element 2 together with CMOS for example which is constructed through lamination as a circuit composing the semiconductor element 2.

It is noted that a number of the dielectric layers of the impedance matching circuit 7 shown in FIG. 13 is not limited to be four and signal lines 21A, 21B, 21C, 21D . . . and the ground conductors 22A, 22B, 22C, 21D . . . may be adequately formed per dielectric layer 20*n*. Still more, although aluminum (Al) and silicon dioxide ($SiO_2$) have been cited as, respectively, the exemplary material of the signal line 21, the ground conductor 22 and the ground layer 29 and as the exemplary materials of the dielectric substrate 20 and the dielectric layer 20*n* shown in FIGS. 11 through 13, the materials are not limited to be those as long as they have the same physical characteristics.

Figure 14A:
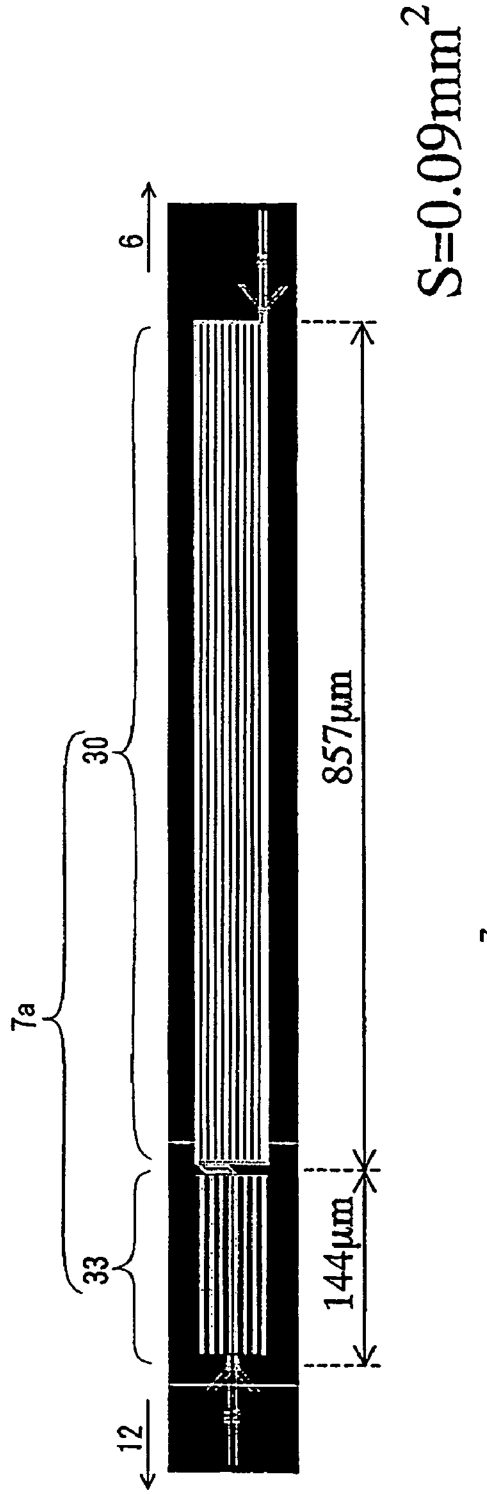
Figure 14B:
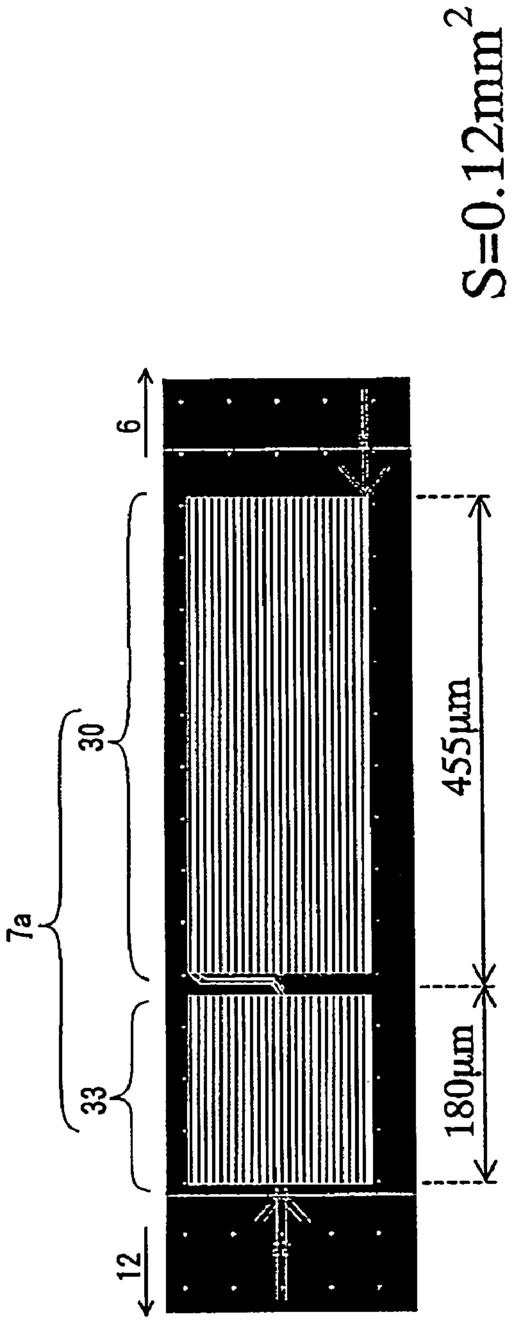

The impedance matching circuit 7 which is composed of the dielectric layer 20*n* thus laminated and whose impedance transmission line 30 is formed in meander as shown in FIG. 10 will be explained with reference to FIG. 14. FIGS. 14A and 14B are top plan views of the transmission line of the impedance matching circuit 7*a* having the miniaturized impedance matching transmission line 30, wherein FIG. 14A shows a case when the fourth metal layer is formed and FIG. 14B shows a case when the fourth metal layer is connected with the fifth metal layer (M4+M5) through the vias 51 and 52. It is noted that the impedance matching circuit 7*a* shown in FIGS. 14A and 14B are both examples designed based the design rule (e.g., 0.25 μm process) of TSMC (registered trademark).

The impedance matching circuit 7*a* in which the fourth metal layer is formed has the K inverter transmission line 33 whose horizontal width is 144 μm and the impedance matching transmission line 30 formed in meander whose horizontal width is 857 μm. Meanwhile, the vertical width of the impedance matching circuit 7*a* is 90 μm. Accordingly, its occupation area S is 1.00 mm×0.09 mm=0.09 $mm^2$.

The impedance matching circuit 7*a* in which the fourth and fifth metal layers are connected through the vias 51 and 52 (see FIG. 13) has the K inverter transmission line 33 whose horizontal width is 180 μm and the impedance matching transmission line 30 formed in meander whose horizontal width is 455 μm. Meanwhile, the vertical width of the impedance matching circuit 7*a* is 190 μm. Accordingly, the occupation area S is 0.64 mm×0.19 mm=0.12 $mm^2$.

Figure 17:
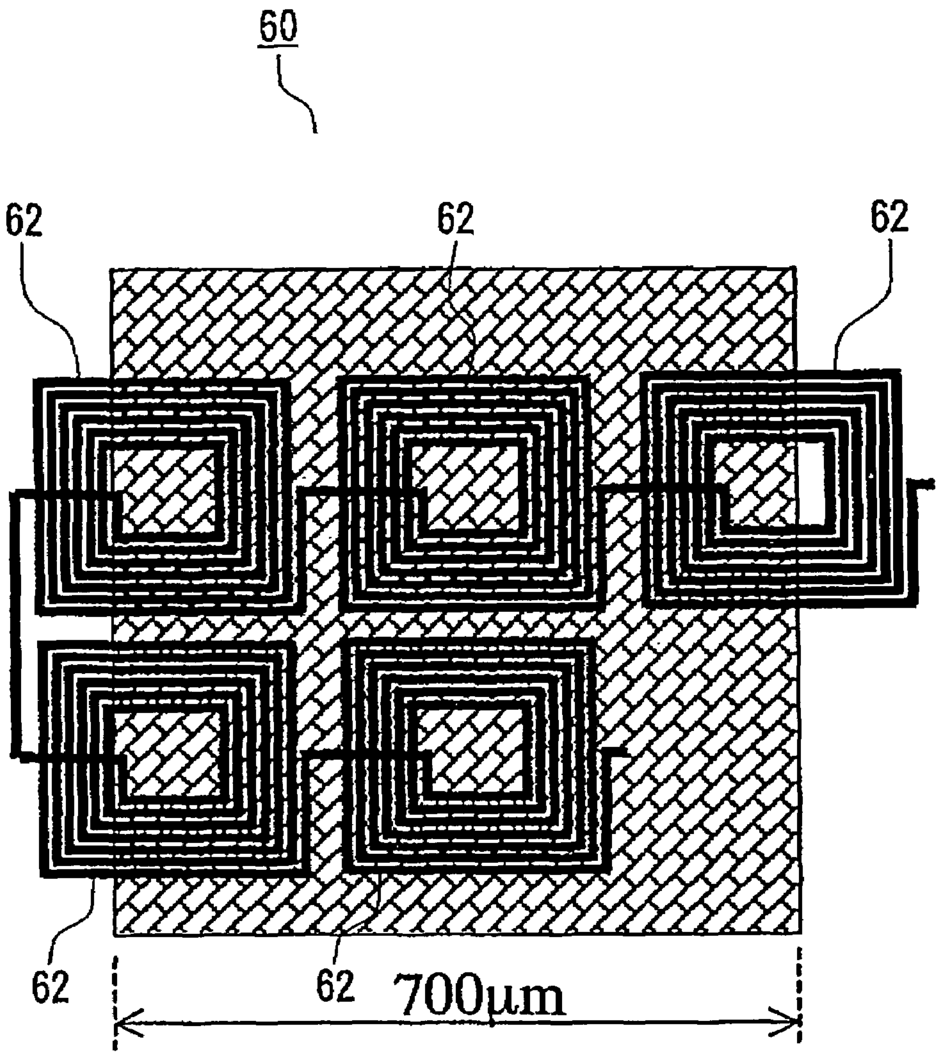
FIG. 17 is a diagram showing a conventional impedance matching circuit composed of concentrated constant elements.

Thus, the occupation area of the impedance matching circuit 7*a* may be about 0.1 $mm^2$ in either cases and may be smaller than the occupation area (0.5 $mm^2$) of the conventional impedance matching circuit 60 shown in FIG. 17. Still more, the impedance matching circuit 7*a* shown in FIG. 14B enables the quality factor Q to be improved because the thickness D of the signal line 21 and the ground conductor 22 is increased as described above.

Figure 15:
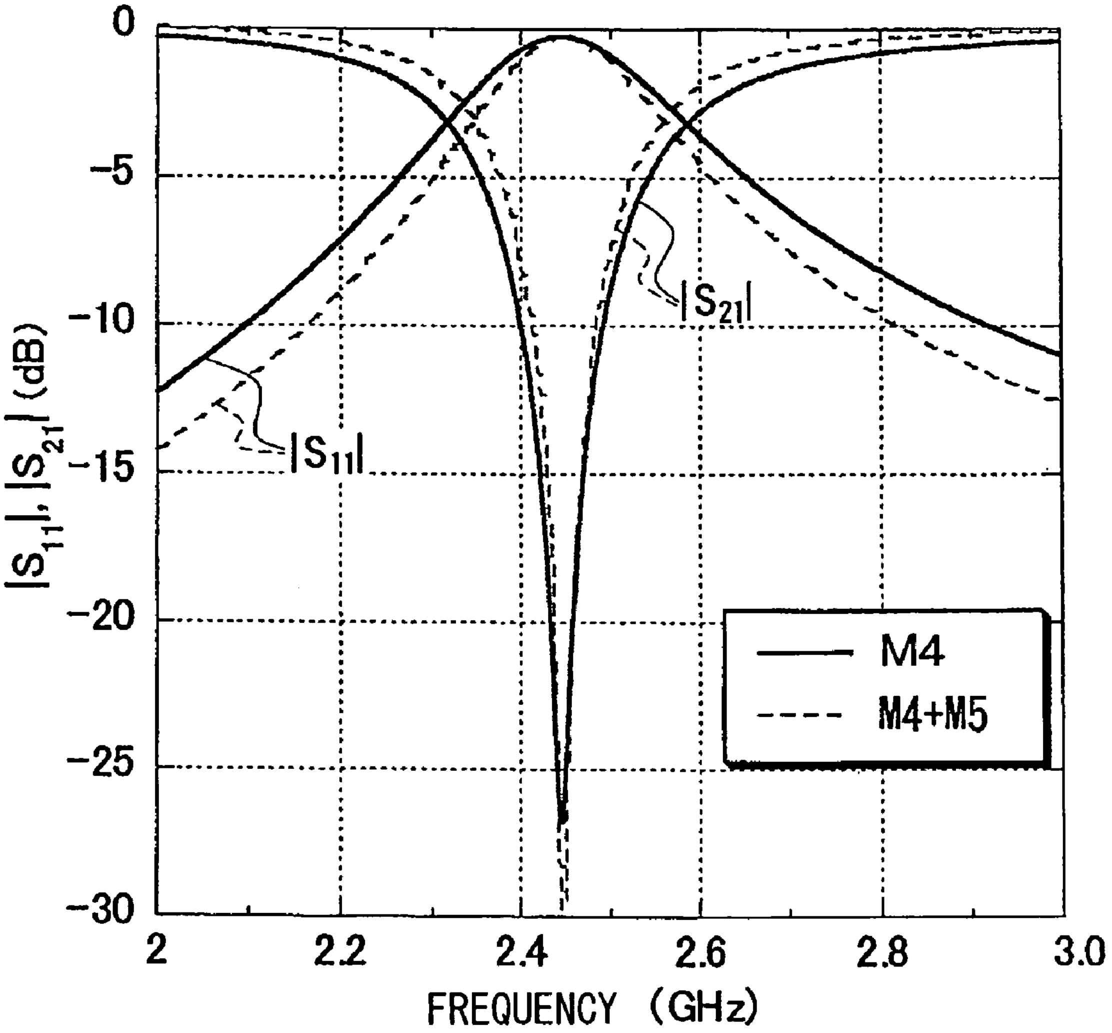
FIG. 15 is a graph showing operation results of an S parameter of the impedance matching circuit shown in FIG. 14.

S parameter calculated based on the electromagnetic simulation described above with respect to the impedance matching circuit 7*a* shown in FIGS. 14A and 14B will be explained with reference to FIG. 15. FIG. 15 is a graph showing operation results of the S parameters of the impedance matching circuit 7*a* shown in FIG. 14.

It is noted that solid lines in the graph indicate the S parameters of the impedance matching circuit 7*a* (see FIG. 14A) in which the fourth metal layer (M4) is formed. Broken lines in the graph indicate the S parameters of the impedance matching circuit 7*a* (see FIG. 14B) in which the fourth and fifth metal layers (M4+M5) are connected through the vias 51 and 52. Still more, as the S parameters, reflection loss $|S_{11}|$ (rate of input signal reflected and returned) and insertion loss $|S_{21}|$ (rate of input signal transmitted in forward direction) are shown.

The reflection loss $|S_{11}|$ has a peak at the upper part of the figure at the center frequency $\omega_0$ and 2.45 GHz and the insertion loss $|S_{21}|$ has a peak at the lower part of the figure at 2.45 GHz. Accordingly, the signal hardly reflects and passes at the center frequency $\omega_0$. Thus, the impedance matching circuit 7*a* functions as a filter enabling the impedance matching and bandwidth adjustment as described above while being miniaturized as shown in FIG. 14.

Further, because the insertion loss $|S_{21}|$ at the center frequency $\omega_0$ of the impedance matching circuit 7*a* (broken line) in which the fourth and fifth metal layers are connected through the vias 51 and 52 is a small value (about −30 dB), the signal loss may be reduced by increasing the thickness D as described above.

It is noted that although one-stage filter of the impedance matching circuit 7 has been shown in the embodiments, it is not limited to be one-stage and may be multi-staged. For example a half-wave multi-stage filter not shown for alternately connecting K inverters with half-wave resonance circuits may be interposed between the K inverter transmission line 33 and the transmission line 35 of the impedance matching circuit 7*a*. It allows a band-pass filter having a high sharp out-of-band attenuation characteristic (cut characteristic) in an out-of-pass band to be constructed and a high frequency selectivity to be realized even in a narrow bandwidth.

Figure 16A:
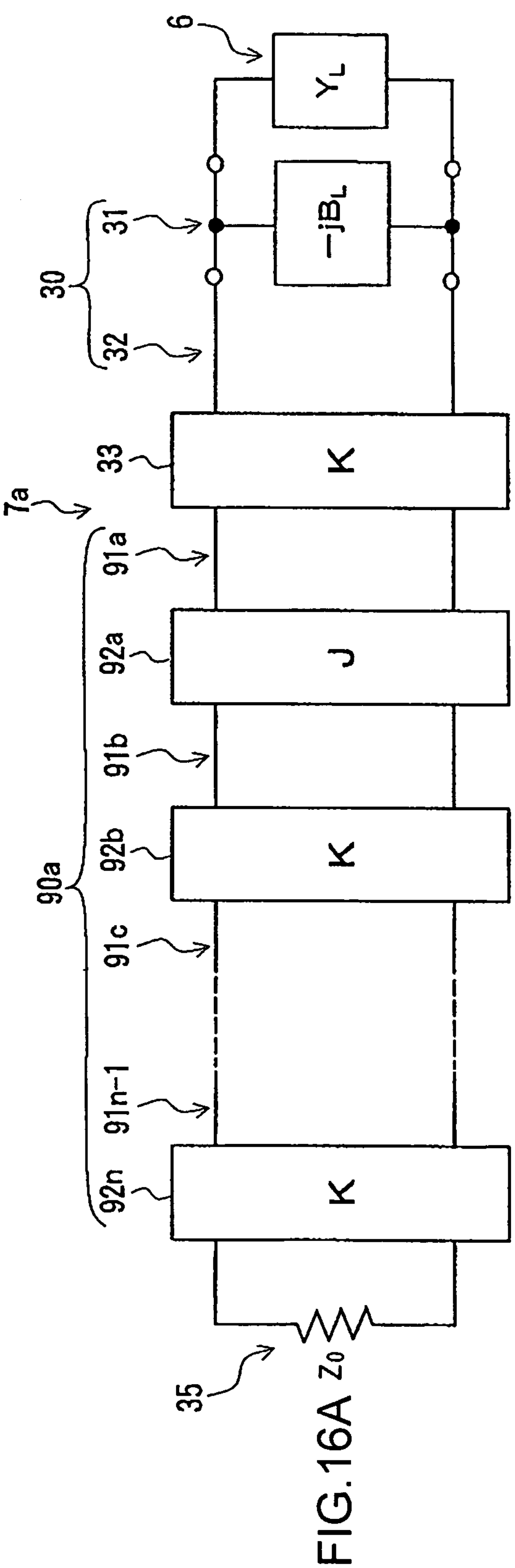

Still more, quarter-wave multi-stage filters 90*a* and 90*b* may be constructed as a band pass filter as shown in FIG. 16. The quarter-wave multi-stage filter 90*a* is interposed between the K inverter transmission line 33 and the transmission line 35 of the impedance matching circuit 7*a* as shown in FIG. 16A and quarter-wave transmission lines (resonance circuit) 91*a*, 91*b*, . . . 91*n*-1 and inverter transmission lines (impedance inverting circuit) 92*a*, 92*b*, . . . 92*n* are alternately connected therein. Still more, the K inverters and the J inverters composing the inverter transmission lines 92*a*, 92*b*, . . . , 92*n* are connected so as to adjacent to each other via the quarter-wave transmission lines 91*a*, 91*b*, . . . , 91*n*-1.

Figure 16B:
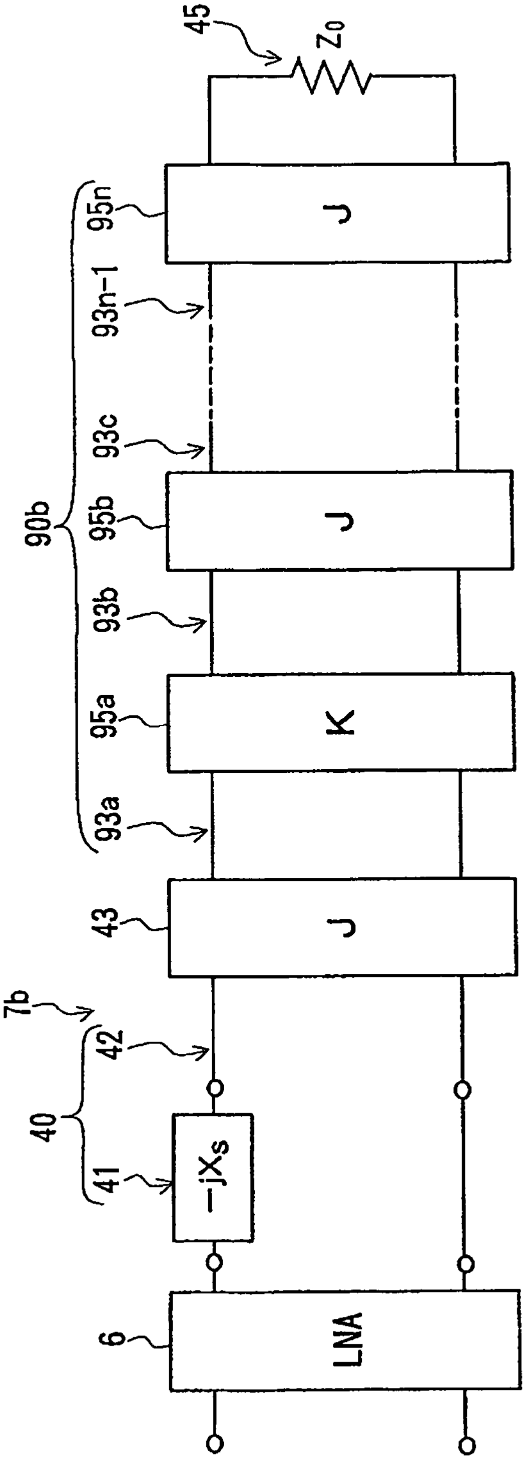

Similarly to that, the quarter-wave multi-stage filter 90*b* is interposed between the J inverter transmission line 43 and the transmission line 45 of the impedance matching circuit 7*b* as shown in FIG. 16B and quarter-wave transmission lines (resonance circuit) 93*a*, 93*b*, . . . 93*n*-1 and inverter transmission lines (impedance inverting circuit) 95*a*, 95*b*, . . . 95*n* are alternately connected therein. Still more, the K inverter sand the J inverters composing the inverter transmission lines 95*a*, 95*b*, . . . 95*n* are connected so as to adjacent to each other via the quarter-wave transmission lines 93*a*, 93*b*, . . . 93*n*-1. It allows the size of the quarter-wave multi-stage filters 90*a* and 90*b* to be reduced to almost a half of the half-wave multi-stage filter described above and the impedance matching circuit 7 to be miniaturized while realizing the high frequency selectivity.

It is noted that the impedance matching circuit 7 which is applied to radio communication has been explained in the foregoing embodiments, the invention is applicable also to wire communications as a matter of course.

Still more, although the impedance matching circuit 7 composed of the coplanar wave-guide has been explained in the embodiments, the invention is applicable also to distributed constant lines such as a micro-strip line in which signal lines and ground conductors are formed respectively on the front and back of the dielectric substrate and a strip line in which the signal line is configured within the dielectric substrate.

As described above, the inventive impedance matching circuit is useful as the impedance matching circuit for transmitting radio signals such as high frequency and microwave and is suitable in constructing the impedance matching circuit on a semiconductor element in particular.

The invention claimed is:

1. An impedance matching circuit comprising a distributed constant line (i) constructed on a dielectric substrate and (ii) operable to output an input signal having a preset bandwidth, wherein said distributed constant line comprises:

a reactance compensating distributed constant line (i) connected to a load and (ii) having a line length of a length compensating reactance of said load;

a quarter-wave distributed constant line (i) connected to said reactance compensating distributed constant line, (ii) having a line length of a quarter wavelength of said input signal and (iii) having a characteristic impedance that is set to correspond to said preset bandwidth; and an impedance inverting distributed constant line (i) connected to said quarter-wave distributed constant line and (ii) including an impedance inverting circuit that corresponds to a degree of impedance of said load and that includes one of a K inverter and a J inverter selectively corresponding to said preset bandwidth, wherein said impedance inverting distributed constant line satisfies $Z_1=(\pi/4)\times[w/(g_1\times g_2\times G_L)]$, and wherein $Z_1$ is the characteristic impedance that is set to correspond to the preset bandwidth, w is the preset bandwidth, $g_1$ and $g_2$ are normalized element values and $G_L$ is the conductance of the load.

2. The impedance matching circuit as set forth in claim 1, wherein said distributed constant line further comprises a narrow band pass distributed constant line including a resonance circuit having a line length of the quarter wavelength of said input signal and including an impedance inverting circuit including the K inverter and the J inverter, the J inverter being adjacent to the K inverter and being connected to the K inverter via said resonance circuit.

3. The impedance matching circuit as set forth in claim 1, wherein said reactance compensating distributed constant line, said quarter-wave distributed constant line and said impedance inverting distributed constant line are comprised of ground conductors and a signal line formed on one face of said dielectric substrate.

4. The impedance matching circuit as set forth in claim 3, wherein a signal line of at least said quarter-wave distributed constant line from among signal lines of said reactance compensating distributed constant line and said quarter-wave distributed constant line meanders.

5. A semiconductor element comprising the impedance matching circuit as set forth in claim 1.

6. A radio communication device comprising the semiconductor element as set forth in claim 5 and an antenna connected to said semiconductor element.

* * * * *